(12) United States Patent
Takahara

(10) Patent No.: US 11,747,714 B2
(45) Date of Patent: *Sep. 5, 2023

(54) IMAGE SENSOR AND IMAGE-CAPTURING DEVICE THAT SELECTS PIXEL SIGNAL FOR FOCAL POSITION

(71) Applicant: NIKON CORPORATION, Tokyo (JP)

(72) Inventor: Hiroaki Takahara, Matsudo (JP)

(73) Assignee: NIKON CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/736,531

(22) Filed: May 4, 2022

(65) Prior Publication Data
US 2022/0260891 A1 Aug. 18, 2022

Related U.S. Application Data

(60) Division of application No. 16/984,641, filed on Aug. 4, 2020, now Pat. No. 11,353,775, which is a
(Continued)

(30) Foreign Application Priority Data

Dec. 25, 2015 (JP) .................................. 2015-254898

(51) Int. Cl.
*G03B 13/32* (2021.01)
*H01L 27/146* (2006.01)
(Continued)

(52) U.S. Cl.
CPC .............. *G03B 13/32* (2013.01); *G02B 7/34* (2013.01); *G03B 13/36* (2013.01); *H01L 27/14* (2013.01);
(Continued)

(58) Field of Classification Search
CPC .......... G03B 13/32; G03B 13/36; G02B 7/34; H01L 27/14; H01L 27/146;
(Continued)

(56) References Cited

U.S. PATENT DOCUMENTS 10,778,879 B2 9/2020 Takahara
11,353,775 B2 * 6/2022 Takahara ............... H04N 23/67
(Continued)

FOREIGN PATENT DOCUMENTS

CN 102375293 A 3/2012
JP 2008-147821 A 6/2008
(Continued)

OTHER PUBLICATIONS

Feb. 14, 2017 International Search Report issued in International Application No. PCT/JP2016/088750.
(Continued)

*Primary Examiner* — Gevell V Selby
(74) *Attorney, Agent, or Firm* — Oliff PLC

(57) ABSTRACT

An image sensor includes: a first pixel having a first photoelectric conversion unit that photoelectrically converts light having entered therein, and a first light blocking unit that blocks a part of light about to enter the first photoelectric conversion unit; and a second pixel having a second photoelectric conversion unit that photoelectrically converts light having entered therein and a second light blocking unit that blocks a part of light about to enter the second photoelectric conversion unit, wherein: the first photoelectric conversion unit and the first light blocking unit are set apart from each other by a distance different from a distance setting apart the second photoelectric conversion unit and the second light blocking unit.

13 Claims, 9 Drawing Sheets

Related U.S. Application Data continuation of application No. 16/064,879, filed as application No. PCT/JP2016/088750 on Dec. 26, 2016, now Pat. No. 10,778,879.

(51) Int. Cl.
| | |
|---|---|
| *G02B 7/34* | (2021.01) |
| *G03B 13/36* | (2021.01) |
| *H01L 27/14* | (2006.01) |
| *H04N 23/63* | (2023.01) |
| *H04N 23/67* | (2023.01) |

(52) U.S. Cl.
CPC ...... *H01L 27/146* (2013.01); *H01L 27/14605* (2013.01); *H01L 27/14623* (2013.01); *H01L 27/14627* (2013.01); *H01L 27/14645* (2013.01); *H04N 23/63* (2023.01); *H04N 23/67* (2023.01)

(58) Field of Classification Search
CPC ......... H01L 27/14605; H01L 27/14623; H01L 27/14627; H01L 27/14645; H04N 23/63; H04N 23/67
See application file for complete search history.

(56) References Cited

U.S. PATENT DOCUMENTS

| | | |
|---|---|---|
| 2009/0146046 A1 | 6/2009 | Katsuda et al. |
| 2009/0225217 A1 | 9/2009 | Katsuda et al. |
| 2011/0063484 A1 | 3/2011 | Fujii et al. |
| 2011/0279727 A1 | 11/2011 | Kusaka |
| 2011/0317042 A1 | 12/2011 | Goto |
| 2012/0044406 A1 | 2/2012 | Shimoda et al. |
| 2012/0113300 A1 | 5/2012 | Hamano |
| 2012/0189293 A1 | 7/2012 | Cao et al. |
| 2012/0224096 A1 | 9/2012 | Shimoda et al. |
| 2013/0016274 A1 | 1/2013 | Matsuo et al. |
| 2013/0021499 A1 | 1/2013 | Ui et al. |
| 2013/0182163 A1 | 7/2013 | Kobayashi et al. |
| 2013/0224897 A1 | 8/2013 | Ishioka |
| 2013/0271646 A1 | 10/2013 | Hamano |
| 2015/0109518 A1 | 4/2015 | Ishii |
| 2016/0018721 A1 | 1/2016 | Okazawa et al. |
| 2016/0049439 A1 | 2/2016 | Yanagita et al. |
| 2016/0118429 A1 | 4/2016 | Otsuji |

FOREIGN PATENT DOCUMENTS

| | | |
|---|---|---|
| JP | 2009-204987 A | 9/2009 |
| JP | 2011-221253 A | 11/2011 |
| JP | 2012-8424 A | 1/2012 |
| JP | 2012-43939 A | 3/2012 |
| JP | 4973478 B2 | 7/2012 |
| JP | 2012-182332 A | 9/2012 |
| JP | 5040700 B2 | 10/2012 |
| JP | 2013-37296 A | 2/2013 |
| JP | 2013-218214 A | 10/2013 |
| JP | 2015-79193 A | 4/2015 |
| JP | 2015-204397 A | 11/2015 |

OTHER PUBLICATIONS

Dec. 18, 2018 Office Action issued in Japanese Patent Application No. 2017-558335.
Sep. 19, 2019 Office Action issued in U.S. Appl. No. 16/064,879.
Jul. 11, 2019 extended Search Report issued in European Patent Application No. 16879055.8.
Mar. 13, 2020 Notice of Allowance issued in U.S. Appl. No. 16/064,879.
Jun. 24, 2020 Notice of Allowance issued in U.S. Appl. No. 16/064,879.
Jun. 16, 2020 Office Action issued in European Patent Application No. 16879055.8.
Jul. 16, 2020 Supplemental Notice of Allowability issued in U.S. Appl. No. 16/064,879.
Oct. 27, 2020 Office Action issued in Japanese Patent Application No. 2019-149115.
Jul. 7, 2021 Office Action issued in U.S. Appl. No. 16/984,641.
Dec. 3, 2021 Office Action issued in Chinese Patent Application No. 201680075596.9.
Feb. 9, 2022 Notice of Allowance issued In U.S. Appl. No. 16/984,641.
Oct. 4, 2022 Office Action issued in Japanese Patent Application No. 2021-134440.

* cited by examiner (a)

(b)

IMAGE SENSOR AND IMAGE-CAPTURING DEVICE THAT SELECTS PIXEL SIGNAL FOR FOCAL POSITION

This is a divisional of U.S. patent application Ser. No. 16/984,641 filed Aug. 4, 2020 (now U.S. Pat. No. 11,353,775), which in turn is a continuation of U.S. patent application Ser. No. 16/064,879 filed Jun. 21, 2018 (now U.S. Pat. No. 10,778,879), which is a U.S. National Stage of International Patent Application No. PCT/JP2016/088750 filed Dec. 26, 2016, which claims the priority benefit of Japanese Patent Application No. 2015-254898 filed in Japan on Dec. 25, 2015. The disclosure of each of the prior applications is hereby incorporated by reference herein in its entirety.

TECHNICAL FIELD

The present invention relates to an image sensor and an image-capturing device.

BACKGROUND ART

There are image sensors known in the related art in which the distance between a microlens and the corresponding light blocking unit at a focus detection pixel used to detect the focusing condition through the split pupil method, is adjusted in correspondence to the position of the focus detection pixel on the image-capturing surface (see, for instance, PTL 1). However, there is an issue yet to be addressed in the technology disclosed in PTL 1 in that the focus detection accuracy is bound to deteriorate when an interchangeable lens with a different exit pupil position is mounted.

CITATION LIST

Patent Literature

PTL 1: Japanese Laid Open Patent Publication No. 2012-43939

SUMMARY OF INVENTION

According to the 1st aspect, an image sensor comprises: a first pixel having a first photoelectric conversion unit that photoelectrically converts light having entered therein, and a first light blocking unit that blocks a part of light about to enter the first photoelectric conversion unit; and a second pixel having a second photoelectric conversion unit that photoelectrically converts light having entered therein and a second light blocking unit that blocks a part of light about to enter the second photoelectric conversion unit, wherein: the first photoelectric conversion unit and the first light blocking unit are set apart from each other by a distance different from a distance setting apart the second photoelectric conversion unit and the second light blocking unit.

According to the 2nd aspect, it is preferable that in the image sensor according to the 1st aspect, the first pixel includes a first microlens and the first photoelectric conversion unit photoelectrically converts light having been transmitted through the first microlens; the second pixel includes a second microlens and the second photoelectric conversion unit photoelectrically converts light having been transmitted through the second microlens; and the first microlens and the first light blocking unit are set apart from each other by the distance different from the distance setting the second microlens apart from the second light blocking unit.

According to the 3rd aspect, it is preferable that in the image sensor according to the 1st or 2nd aspect, the first pixel includes a first output unit that outputs a signal generated based upon an electric charge generated by the first photoelectric conversion unit through photoelectrically converting light having been transmitted through an optical system and having entered therein; the second pixel includes a second output unit that outputs a signal generated based upon an electric charge generated by the second photoelectric conversion unit through photoelectrically converting light having been transmitted through the optical system and entered therein; and at least one of the signal output from the first output unit and the signal output from the second output unit is a signal used to execute control so as to set the optical system at a position at which an image formed via the optical system is in an in-focus state at the image sensor.

According to the 4th aspect, it is preferable that in the image sensor according to any one of the 1st through 3rd aspects, the first light blocking unit has an area different from an area of the second light blocking unit.

According to the 5th aspect, the image sensor according to any one of the 1st through 4th aspects may further comprise: a plurality of first pixels and a plurality of second pixels; and wherein: the first light blocking units included in at least two first pixels among the plurality of first pixels have areas different from each other in correspondence to positions at the image sensor; and the second light blocking units included in at least two second pixels among the plurality of second pixels have areas different from each other in correspondence to positions at the image sensor.

According to the 6th aspect, it is preferable that in the image sensor according to the 5th aspect, the first light blocking unit included in the first pixel located near a center of the image sensor, among the plurality of first pixels, has an area smaller than the area of the first light blocking unit included in the first pixel located near an edge of the image sensor; and the second light blocking unit included in the second pixel located near the center of the image sensor, among the plurality of second pixels, has an area smaller than the area of the second light blocking unit included in the second pixel located near an edge of the image sensor.

According to the 7th aspect, it is preferable that in the image sensor according to any one of the 1st through 6th aspects, the first pixel includes a third light blocking unit that blocks part of light about to enter the first photoelectric conversion unit; and the second pixel includes a fourth light blocking unit that blocks part of light about to enter the second photoelectric conversion unit.

According to the 8th aspect, it is preferable that in the image sensor according to the 7th aspect, the first light blocking unit has an area different from an area of the third light blocking unit; and the second light blocking unit has an area different from an area of the fourth light blocking unit.

According to the 9th aspect, it is preferable that in the image sensor according to the 8th aspect, the first light blocking unit has an area greater than the area of the third light blocking unit; and the second light blocking unit has an area greater than the area of the fourth light blocking unit.

According to the 10th aspect, it is preferable that in the image sensor according to any one of the 1st through 9th aspects, the first light blocking unit is a circuit wiring disposed in the first pixel and the second light blocking unit is a circuit wiring disposed in the second pixel.

According to the 11th aspect, the image sensor according to any one of the 1st through 10th aspects may further comprises: a plurality of first pixels, a plurality of second pixels and a third pixel having a third photoelectric conversion unit that photoelectrically converts light having entered therein; and wherein the third pixel is disposed at least one of between the plurality of first pixels and between the plurality of second pixels.

According to the 12th aspect, it is preferable that in the image sensor according to any one of the 1st through 11th aspects, a plurality of first pixels and a plurality of second pixels are disposed; at least two first pixels among the plurality of first pixels are disposed adjacent to each other; and at least two second pixels among the plurality of second pixels are disposed adjacent to each other.

According to the 13th aspect, it is preferable that in the image sensor according to the 12th aspect, the two first pixels disposed adjacent to each other share the first light blocking unit, or the two second pixels disposed adjacent to each other share the second light blocking unit.

According to the 14th aspect, the image sensor according to any one of the 1st through 13th aspects may further comprises: a plurality of first pixels and a plurality of second pixels; and wherein the first pixels are disposed in a quantity different from a quantity of the second pixels.

According to the 15th aspect, an image-capturing device comprises: an image sensor having disposed thereat; a first pixel that includes a first photoelectric conversion unit photoelectrically converting light having been transmitted through an optical system and entered therein so as to generate an electric charge, and a first light blocking unit that blocks part of light about to enter the first photoelectric conversion unit, set apart from the first photoelectric conversion unit by a first distance; and a second pixel that includes a second photoelectric conversion unit photoelectrically converting light having been transmitted through the optical system and entered therein so as to generate an electric charge, and a second light blocking unit that blocks part of light about to enter the second photoelectric conversion unit, set apart from the second photoelectric conversion unit by a second distance; and a control unit that controls a position of the optical system so as to set the optical system at a position at which an image formed via the optical system is in an in-focus state at the image sensor, by using at least one of a signal generated based upon the electric charge generated at the first pixel and a signal generated based upon the electric charge generated at the second pixel.

According to the 16th aspect, it is preferable that in the image-capturing device according to the 15th aspect, the image sensor includes a plurality of first pixels and a plurality of second pixels; and the control unit controls the position of the optical system by using at least one of signals generated based upon electric charges generated at the plurality of first pixels and signals generated based upon electric charges generated at the plurality of second pixels.

According to the 17th aspect, it is preferable that in the image-capturing device according to the 15th or 16th aspect, the control unit controls the position of the optical system by selecting, based upon information regarding the optical system, at least one of the signal generated based upon the electric charge generated at the first pixel and the signal generated based upon the electric charge generated at the second pixel.

According to the 18th aspect, it is preferable that in the image-capturing device according to the 17th aspect, the image sensor includes a plurality of focus detection areas each containing the first pixel and the second pixel; and further comprises a selection unit that is able to select any focus detection area among the plurality of focus detection areas; and wherein if the selection unit selects a focus detection area located near a center of the image sensor, the control unit controls the position of the optical system by selecting, based upon the information regarding the optical system, at least one of the signal generated based upon the electric charge generated at the first pixel and the signal generated based upon the electric charge generated at the second pixel.

According to the 19th aspect, it is preferable that in the image-capturing device according to the 17th or 18th aspect, the control unit controls the position of the optical system by applying weight to at least one of the signal generated based upon the electric charge generated at the first pixel and the signal generated based upon the electric charge generated at the second pixel.

According to the 20th aspect, the image-capturing device according to any one of the 15th through 19th aspects may further comprise: a storage unit in which information regarding the optical system is stored.

According to the 21st aspect, the image-capturing device according to any one of the 15th through 19th aspect may further comprise: a reception unit that receives information regarding the optical system, provided from an interchangeable lens that includes the optical system.

According to the 22nd aspect, it is preferable that in the image-capturing device according to the 20th or 21st aspect, the information regarding the optical system is information indicating a position of an exit pupil of the optical system.

DESCRIPTION OF EMBODIMENT

In reference to drawings, the image sensor achieved in an embodiment, and a focus detection device and an image-capturing device, each having the image sensor installed therein, will be described.

Figure 1:
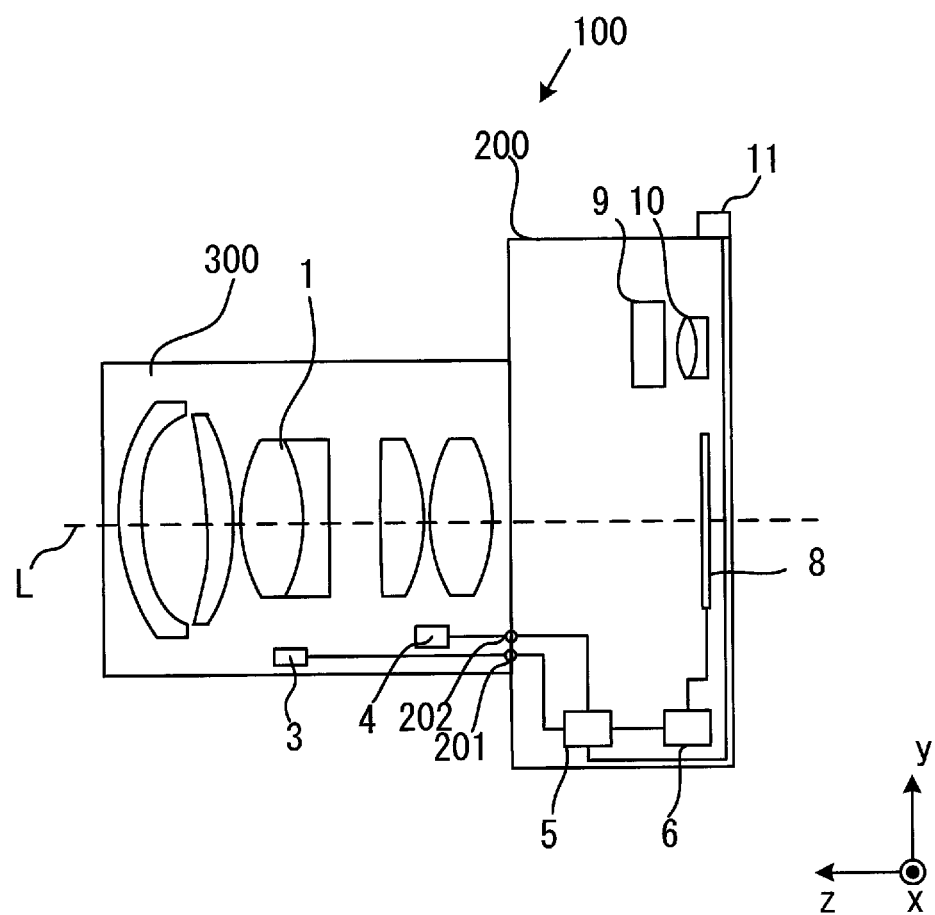
FIG. 1 The structure of the image-capturing device achieved in an embodiment, illustrated in a lateral sectional view FIG. 2 A block diagram showing the essential structure of the image-capturing device achieved in the embodiment FIG. 3 Illustrations presenting an example of a positional arrangement with which image-capturing pixels and focus detection pixels may be disposed in the image sensor in the embodiment FIG. 4 Examples of structures that may be adopted in the image-capturing pixels and the focus detection pixels, illustrated in schematic sectional views FIG. 5 Illustrations, each indicating the position at which the light blocking unit in a focus detection pixel is projected via the microlens FIG. 6 Schematic illustrations, each indicating the relationship between light fluxes entering focus detection pixels and the exit pupil areas at the photographic optical system observed in the embodiment FIG. 7 Examples of light blocking units that may be included in focus detection pixels achieved in a variation FIG. 8 Other examples of structures that may be adopted in focus detection pixels, illustrated in schematic sectional views FIG. 9 Other examples of structures that may be adopted in focus detection pixels, illustrated in schematic sectional views

The image-capturing device in the embodiment takes the form of a digital camera 100 structured as illustrated in the lateral sectional view in FIG. 1. It is to be noted that a coordinate system that includes an x-axis, a y-axis and a z-axis is set as shown in the figure so as to facilitate the explanation.

The digital camera 100 is a camera widely known as a mirrorless camera configured with a camera body 200 and a photographic lens body 300, with the photographic lens body 300 mounted via a mount unit (not shown). Photographic lens bodies 300 with various photographic optical systems can be mounted at the camera body 200 via the mount unit. The mount unit includes electrical contact points 201 and 202 and thus, an electrical connection is achieved via the electrical contact points 201 and 202 once the camera body 200 and the photographic lens body 300 become coupled.

A photographic optical system 1, a drive mechanism 3 and a lens data unit 4 are disposed in the photographic lens body 300. The photographic optical system 1 is an optical system via which a subject image is formed on the image-capturing surface of an image sensor 8 and is configured with a plurality of lenses including a focusing lens. The drive mechanism 3 calculates a lens drive quantity based upon a defocus quantity input from the camera body 200 via the electrical contact point 201 and drives the focusing lens, constituting part of the photographic optical system 1, to the focal position along the direction in which an optical axis L extends (along the z-axis) in correspondence to the lens drive quantity.

In the lens data unit 4 constituted with, for instance, a non-volatile recording medium, various types of lens information related to the photographic lens body 300, such as the position of the exit pupil in the photographic optical system 1, are stored. The lens data unit 4 transmits the lens information and the like to the camera body 200 via the electrical contact point 202.

A control unit 5, an image sensor drive circuit 6, the image sensor 8, an electronic viewfinder (EVF) 9 and an eyepiece lens 10 are disposed inside the camera body 200. In addition, an operation unit 11 is disposed at the camera body 200. Image-capturing pixels and focus detection pixels, such as CCD or CMOS, are disposed in a two-dimensional pattern (along rows and columns) over the x-y plane at the image sensor 8. An image-capturing pixel receives a light flux having passed through the entire range of the exit pupil area at the photographic optical system 1 and outputs an image signal to the control unit 5. A focus detection pixel receives a light flux having passed through only part of the exit pupil area, e.g., a left side, a right side, an upper side or a lower side of the exit pupil area, at the photographic optical system 1, and outputs a focus detection signal to the control unit 5. The image-capturing pixels at the image sensor 8 each include an R (red) color filter, a G (green) color filter or a B (blue) color filter disposed thereat. Since the image-capturing pixels capture a subject image via the color filters, the image-capturing signals contain color information expressed in the RGB colorimetric system. It is to be noted that the focus detection pixels do not need to include color filters or color filters of a single type (e.g., G color filters) may be disposed at all the focus detection pixels. It is also to be noted that the image sensor 8 will be described in detail later.

At the electronic viewfinder 9, an image corresponding to display image data generated by the control unit 5 is displayed. In addition, the electronic viewfinder 9 provides display of various types of information (such as the shutter speed, the aperture value and the ISO sensitivity) related to photographing conditions. The user is able to view the image and the various types of information displayed at the electronic viewfinder 9 via the eyepiece lens 10. It is to be noted that the image and the various types of information may be displayed at a backside monitor (not shown).

The operation unit 11 includes various switches, each disposed in correspondence to one of various operation members operated by the user, and outputs an operation signal, which corresponds to the user operation performed at an operation member, to the control unit 5. The operation members include, for instance, a shutter release button, a menu button operated to bring up a menu screen at the backside monitor (not shown) located on the back side of the camera body 200, a cross-key operated to select various settings and the like, an OK button operated to confirm a setting or the like selected via the cross-key, an operation mode selector button operated to switch to an operation in a photographing mode or in a reproduction mode for the digital camera 1 and an exposure mode selector button operated to set an exposure mode.

Figure 2:
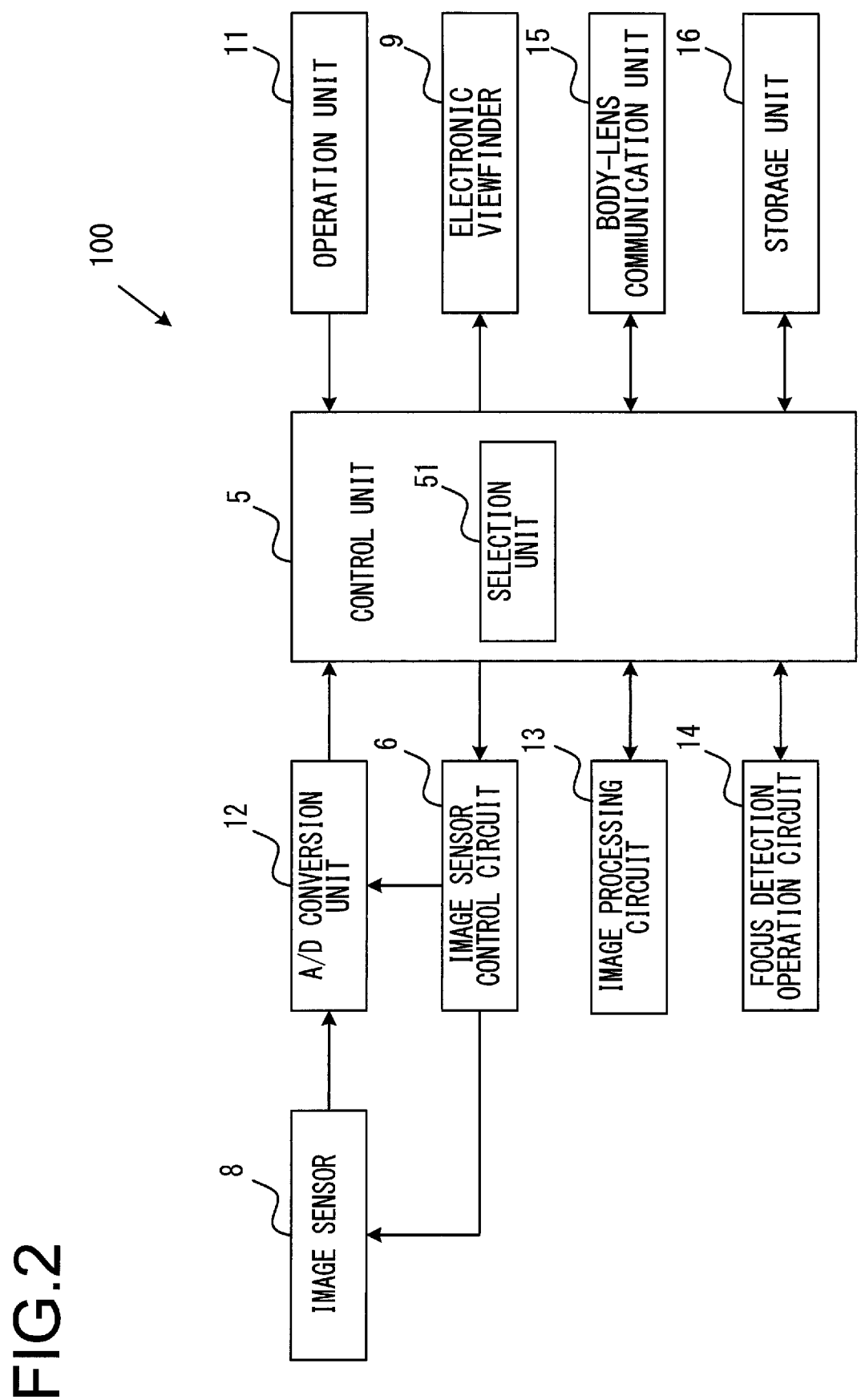

The control system in the digital camera 100 will be explained in reference to the block diagram presented in FIG. 2. As shown in FIG. 2, the digital camera 100 includes an A/D conversion unit 12, an image processing circuit 13, a focus detection operation circuit 14, a body-lens communication unit 15 and a storage unit 16. The control unit 5, which includes a CPU, a ROM, a RAM and the like, is an arithmetic operation circuit that controls various components of the digital camera 100 and executes various types of data processing based upon a control program. The control program is stored in a non-volatile memory (not shown) within the control unit 5. The control unit 5 includes a selection unit 51, realized in the form of a functional unit, and selects focus detection pixels that are to output focus detection signals to be used for purposes of focus detection operation, among the focus detection pixels in the image sensor 8. It is to be noted that the selection unit 51 will be described in specific detail later. The image sensor drive circuit 6, which is controlled by the control unit 5, engages the image sensor 8 in electric charge storage, image-capturing signal read out and the like by controlling the drive of the image sensor 8 and the drive of the A/D conversion unit 12. The A/D conversion unit 12 converts analog image-capturing signals, output from the image sensor 82, to digital signals.

The image-capturing signals output from the image-capturing pixels in the image sensor 8 are used as image signals by the image processing circuit 13, which generates image data by executing various types of image processing on the image signals and then generates an image file by appending additional information and the like to the image data. The image processing circuit 13 records the image file thus generated into a recording medium such as a memory card (not shown). The image processing circuit 13 generates display image data to be used to be displayed at the electronic viewfinder 9 or the backside monitor (not shown) based upon image data it has generated or image data recorded in the recording medium.

The focus detection operation circuit 14 calculates a defocus quantity through the phase detection method of the known art by using the focus detection signals output from focus detection pixels in the image sensor 8. The body-lens communication unit 15, which is controlled by the control unit 5, engages in communication with the drive mechanism 3 and the lens data unit 4 within the photographic lens body 300 via the electrical contact points 201 and 202 so as to transmit camera information (such as the defocus quantity and an aperture value) and receive lens information (e.g., the position of the exit pupil).

In the storage unit 16, which may be, for instance, a non-volatile storage medium, a program that enables the control unit 5 to execute various types of processing, data used by the control unit 5 when it executes the various types of processing and the like are stored.

Next, the image sensor 8 achieved in the embodiment will be described in detail.

Figure 3:
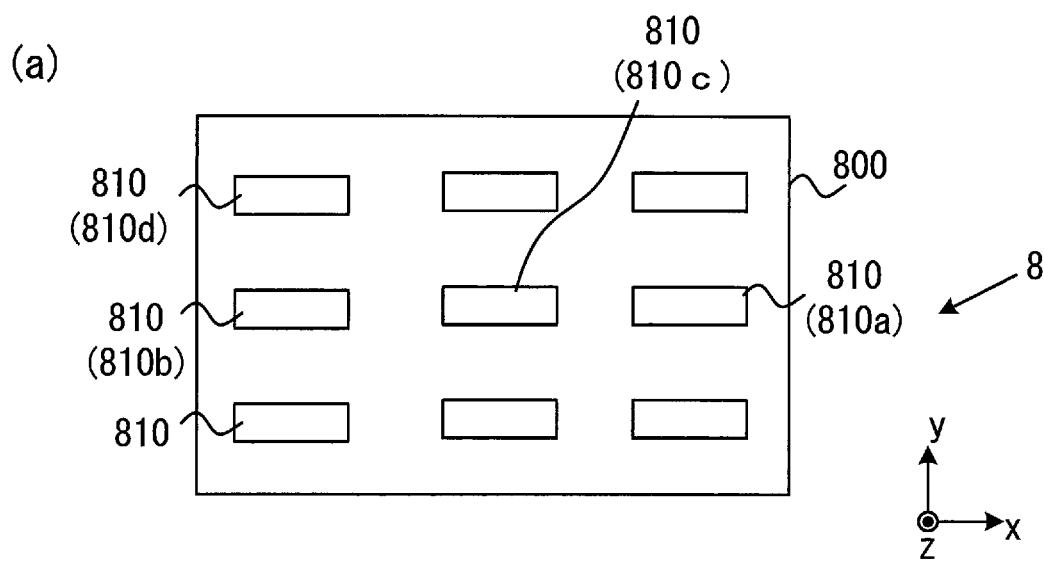
Figure 3:
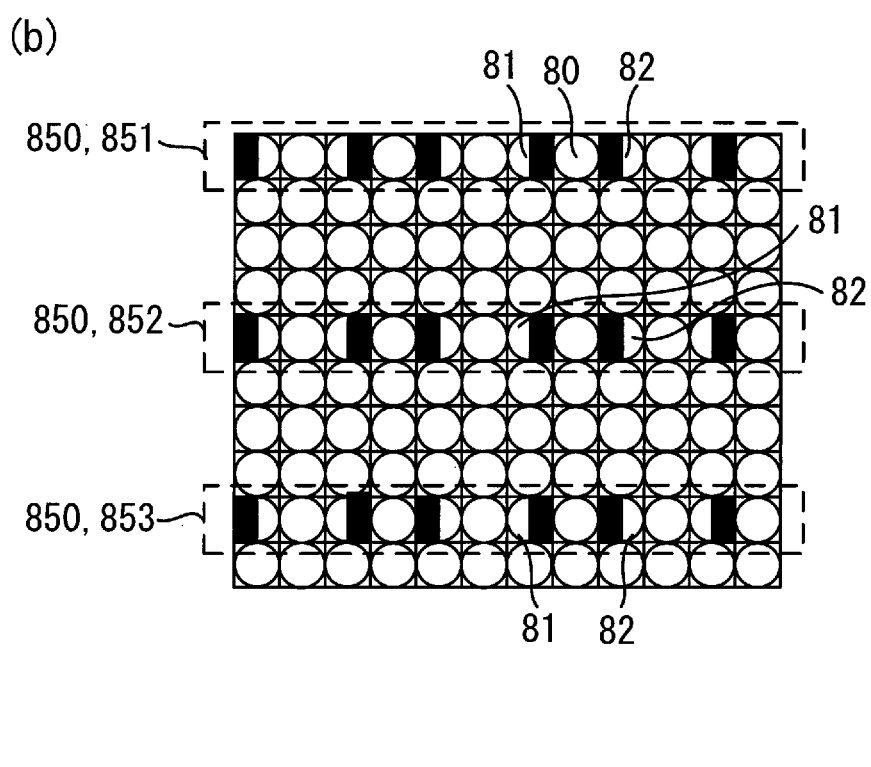

FIG. 3(a) schematically illustrates an image-capturing surface 800 of the image sensor 8. It is to be noted that a coordinate system that includes the x-axis, the y-axis and the z-axis is set in FIG. 3, in much the same way as in the example presented in FIG. 1. Focus detection areas 810, from which focus detection signals to be used in the arithmetic operation executed to calculate the defocus quantity are obtained, are set at the image-capturing surface 800. It is to be noted that while nine focus detection areas 810 are set in the example presented in the figure, the number of focus detection areas 810 is not limited to this example.

FIG. 3(b) shows part of a focus detection area 810a, set at the periphery of the image-capturing surface 800 on the + side along the x-axis, in a schematic enlargement. The focus detection area 810a contains a first pixel group 851, a second pixel group 852 and a third pixel group 853 (may each be generically referred to as a pixel group 850). It is to be noted that while the pixel groups 850 are disposed over three rows in the example presented in FIG. 3(b), pixel groups do not need to be disposed over three rows. In addition, the order with which the first pixel group 851, the second pixel group 852 and the third pixel group 853 are set along the y-axis is not limited to that in the example presented in FIG. 3(b) and they may be disposed in any order. The differences among the first pixel group 851, the second pixel group 852 and the third pixel group 853 will be explained later.

In a pixel group 850, the position next to an image-capturing pixel 80 on a given side along the x-axis is alternately taken by a focus detection pixel 81 or a focus detection pixel 82, i.e., image-capturing pixels 80 are each disposed between a plurality of focus detection pixels 81. In other words, the pixel group 850 extends along the x-axis. The first pixel group 851, the second pixel group 852 and the third pixel group 853 are set apart from each other along the y-axis. Image-capturing pixels 80 are disposed in the area separating the first pixel group 851 and the second pixel group 852 from each other along the y-axis and in the area separating the second pixel group 852 and the third pixel group 853 from each other along the y-axis.

The first pixel group 851, the second pixel group 852 and the third pixel group 853 in the embodiment are configured so that focus detection signals can be output from the focus detection pixels 81 and 82 in the individual pixel groups in correspondence to exit pupil positions different from one another, that may be taken at the photographic optical system 1. Accordingly, the light blocking units in the first pixel group 851, the second pixel group 852 and the third pixel group 853 take positions different from one another. The following is a description of the structures adopted in the image-capturing pixels 80 and the focus detection pixels 81 and 82 included in the first pixel group 851, the second pixel group 852 and the third pixel group 853.

Figure 4:
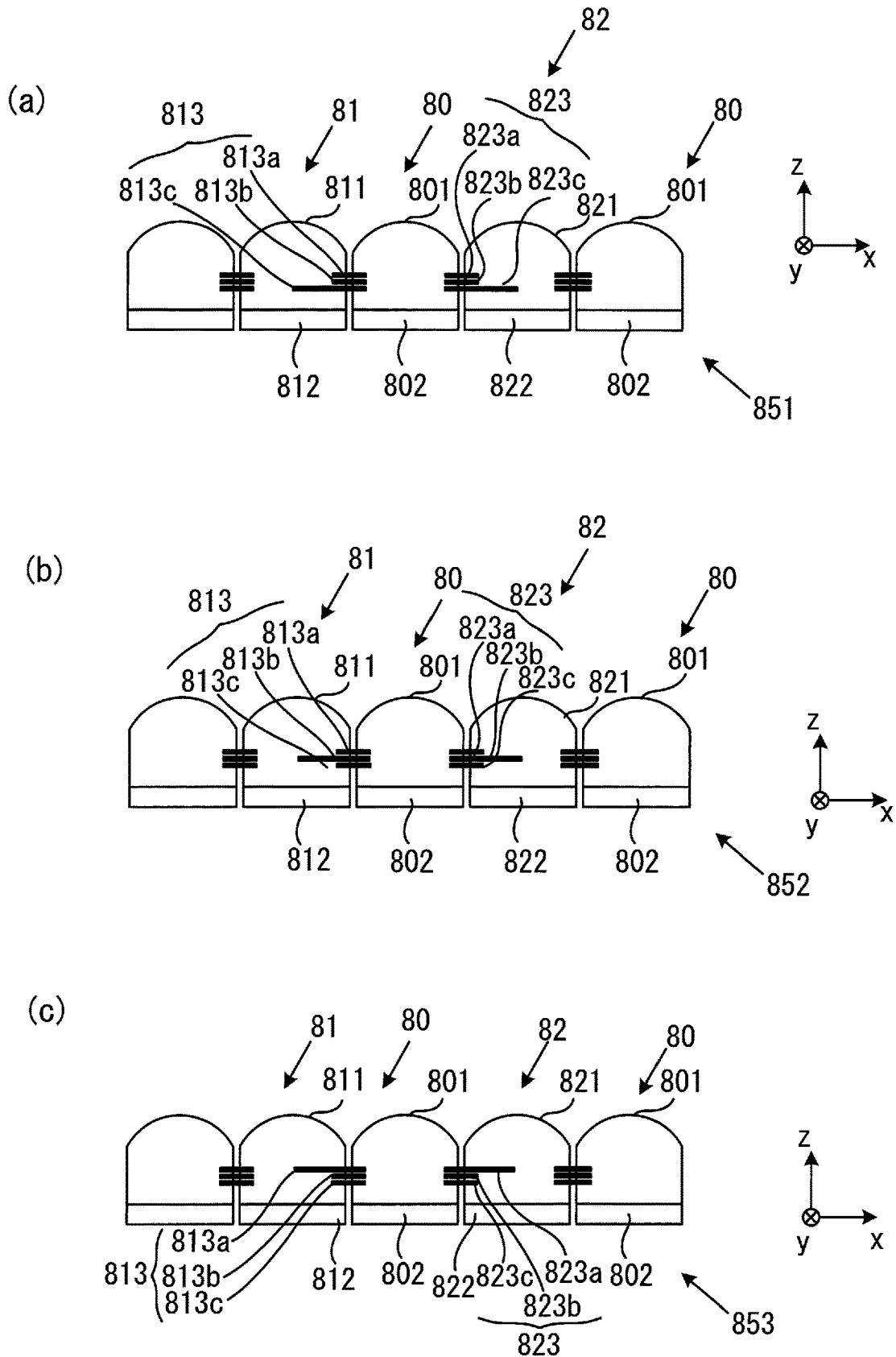

FIG. 4(a) schematically illustrates the structures of the image-capturing pixels 80 and the focus detection pixels 81 and 82 included in the first pixel group 851 in a sectional view, FIG. 4(b) schematically illustrates the structures of the image-capturing pixels 80 and the focus detection pixels 81 and 82 included in the second pixel group 852 in a sectional view, and FIG. 4(c) schematically illustrates the structures of the image-capturing pixels 80 and the focus detection pixels 81 and 82 included in the third pixel group 853 in a sectional view. It is to be noted that in FIG. 4, too, a coordinate system that includes the x-axis, the y-axis and the z-axis is set, in much the same way as in the examples presented in FIG. 1 and FIG. 3.

—First Pixel Group 851—

The focus detection pixels 81 in the first pixel group 851 each include a microlens 811, a photoelectric conversion unit 812 disposed below the microlens 811, and a light blocking unit 813. The light blocking unit 813 is disposed between the microlens 811 and the photoelectric conversion unit 812. A light flux, having departed the photographic optical system 1 and passed through the microlens 811, enters the photoelectric conversion unit 812 with part of the light flux blocked (restricted) by the light blocking unit 813.

The light blocking unit 813 is constituted with a circuit wiring for the focus detection pixel 81, which may be manufactured by using an electrically conductive material such as aluminum. The light blocking unit 813 restricts light that would otherwise travel toward the + side of the x-axis in the focus detection pixel 81. The light blocking unit 813 includes a first light blocking portion 813a, a second light blocking portion 813b and a third light blocking portion 813c set apart from the microlens 811 over distances different from one another. In the embodiment, the distance between the microlens 811 and the second light blocking portion 813b is set greater than the distance between the microlens 811 and the first light blocking portion 813a. The distance between the microlens 811 and the third light blocking portion 813c is a set greater than the distance between the microlens 811 and the second light blocking portion 813b.

In the focus detection pixel 81 in the first pixel group 851, the third light blocking portion 813c has an area (i.e., a light blocking area) on a plane ranging parallel to the X-Y plane, which is greater than the corresponding light blocking areas of the first light blocking portion 813a and the second light blocking portion 813b. In other words, the light flux is restricted by the third light blocking portion 813c, set apart from the microlens 811 by the greatest distance, at the focus detection pixel 81.

The focus detection pixels 82 in the first pixel group 851 each include a microlens 821, a photoelectric conversion unit 822 disposed below the microlens 821, and a light blocking unit 823. The microlens 821 has a focal length equal to that of the microlens 811 in the focus detection pixel 81. The distance between the photoelectric conversion unit 822 and the microlens 821 is equal to the distance between the photoelectric conversion unit 812 and the microlens 811 at the focus detection pixel 81. The light blocking unit 823 is disposed between the microlens 821 and the photoelectric conversion unit 822. A light flux, having departed the photographic optical system 1 and passed through the microlens 821, enters the photoelectric conversion unit 822 with part of the light flux blocked (restricted) by the light blocking unit 823.

The light blocking unit 823 is constituted with a circuit wiring for the focus detection pixel 82, which may be manufactured by using an electrically conductive material such as aluminum. The light blocking unit 823 restricts light that would otherwise travel toward the − side of the x-axis in the focus detection pixel 82. The light blocking unit 823 includes a first light blocking portion 823a, a second light blocking portion 823b and a third light blocking portion 823c set apart from the microlens 821 over distances different from one another. In the embodiment, the distance between the microlens 821 and the second light blocking portion 823b is set greater than the distance between the microlens 821 and the first light blocking portion 823a. The distance between the microlens 821 and the third light blocking portion 823c is a set greater than the distance between the microlens 821 and the second light blocking portion 823b. The distance between the third light blocking portion 823c and the microlens 821 is equal to the distance between the third light blocking portion 813c and the microlens 811 at the focus detection pixel 81.

At the focus detection pixel 82, too, the third light blocking portion 823c has an area (i.e., a light blocking area) on a plane ranging parallel to the X-Y plane, which is greater than the corresponding light blocking areas of the first light blocking portion 823a and the second light blocking portion 823b. In other words, the light flux is restricted by the third light blocking portion 823c, set apart from the microlens 821 by the greatest distance, at the focus detection pixel 81.

In the first pixel group 851, which includes the focus detection pixels 81 and 82 structured as described above, light fluxes having departed different areas of the photographic optical system 1 are restricted by the third light blocking portions 813c and 823c set apart from the micro-lenses 811 and 821 over distances equal to each other. Namely, light fluxes having departed different areas of the photographic optical system 1, enter the photoelectric conversion units 812 and 822 at the pair of focus detection pixels 81 and 82 in the first pixel group 851, as a pair of subject light fluxes to be used by the focus detection operation circuit 14 for a phase detection operation.

The image-capturing pixels 80 each include a microlens 801 and a photoelectric conversion unit 802 disposed below the microlens 801. A light flux having passed through the entire range of the photographic optical system 1 enters the photoelectric conversion unit 802 via the microlens 801. It is to be noted that the image-capturing pixels 80 disposed in the second pixel group 852 and the third pixel group 853 assume a structure identical to that described above. In addition, image-capturing pixels 80 disposed outside the pixel groups 850, too, assume a structure identical to that described above.

—Second Pixel Group 852—

The focus detection pixels 81 and 82 included in the second pixel group 852 will be described by focusing on the differences from the focus detection pixels 81 and 82 in the first pixel group 851. Any features not specifically noted are assumed to be identical to those of the focus detection pixels 81 and 82 in the first pixel group 851. At each focus detection pixel 81 in the second pixel group 852, the second light blocking portion 813b has a light blocking area, on a plane ranging parallel to the X-Y plane, which is greater than the corresponding light blocking areas of the first light blocking portion 813a and the third light blocking portion 813c. In other words, entry of light toward the + side along the x-axis is restricted at the focus detection pixel 81 by the second light blocking portion 813b disposed between the first light blocking portion 813a and the third light blocking portion 813c, viewed from the side where the microlens 821 is located.

At each focus detection pixel 82 in the second pixel group 852, the second light blocking portion 823b has a light blocking area, on a plane ranging parallel to the X-Y plane, which is greater than the corresponding light blocking areas of the first light blocking portion 823a and the third light blocking portion 823c. In other words, entry of light toward the − side along the x-axis is restricted at the focus detection pixel 82 by the second light blocking portion 823b disposed between the first light blocking portion 823a and the third light blocking portion 823c, viewed from the side where the microlens 821 is located. In the second pixel group 852, which includes the focus detection pixels 81 and 82 structured as described above, light fluxes having departed different areas of the photographic optical system 1 are restricted by the second light blocking portions 813b and 823b set apart from the micro-lenses 811 and 821 over distances equal to each other. Namely, light fluxes, having departed different areas of the photographic optical system 1, enter the photoelectric conversion units 812 and 822 at the pair of focus detection pixels 81 and 82 in the second pixel group 852, as a pair of subject light fluxes to be used by the focus detection operation circuit 14 for a phase detection operation.

—Third Pixel Group 853—

The focus detection pixels 81 and 82 included in the third pixel group 853 will be described by focusing on the differences from the focus detection pixels 81 and 82 in the first pixel group 851. Any features not specifically noted are assumed to be identical to those of the focus detection pixels 81 and 82 in the first pixel group 851. At each focus detection pixel 81 in the third pixel group 853, the first light blocking portion 813a has a light blocking area, on a plane ranging parallel to the X-Y plane, which is greater than the corresponding light blocking areas of the second light blocking portion 813b and the third light blocking portion 813c. In other words, entry of light toward the + side along the x-axis is restricted at the focus detection pixel 81 by the first light blocking portion 813a set apart from the microlens 821 by the smallest distance.

At each focus detection pixel 82 in the third pixel group 853, the first light blocking portion 823a has a light blocking area, on a plane ranging parallel to the X-Y plane, which is greater than the corresponding light blocking areas of the second light blocking portion 823b and the third light blocking portion 823c. In other words, entry of light toward the − side along the x-axis is restricted by the first light blocking portion 823a, set apart from the microlens 821 by the smallest distance. In the third pixel group 853, which includes the focus detection pixels 81 and 82 structured as described above, light fluxes having departed different areas of the photographic optical system 1 are restricted by the first light blocking portions 813a and 823a set apart from the micro-lenses 811 and 821 over distances equal to each other. Namely, light fluxes, having departed different areas of the photographic optical system 1, enter the photoelectric conversion units 812 and 822 at the pair of focus detection pixels 81 and 82 in the third pixel group 853, as a pair of subject light fluxes to be used by the focus detection operation circuit 14 for a phase detection operation.

As explained above, entry of light at the focus detection pixels 81 and 82 is restricted via the light blocking units 813 and 823 at positions (over distances from the micro-lenses 811 and 821) different from one another among the first pixel group 851, the second pixel group 852 and the third pixel group 853.

Figure 5:
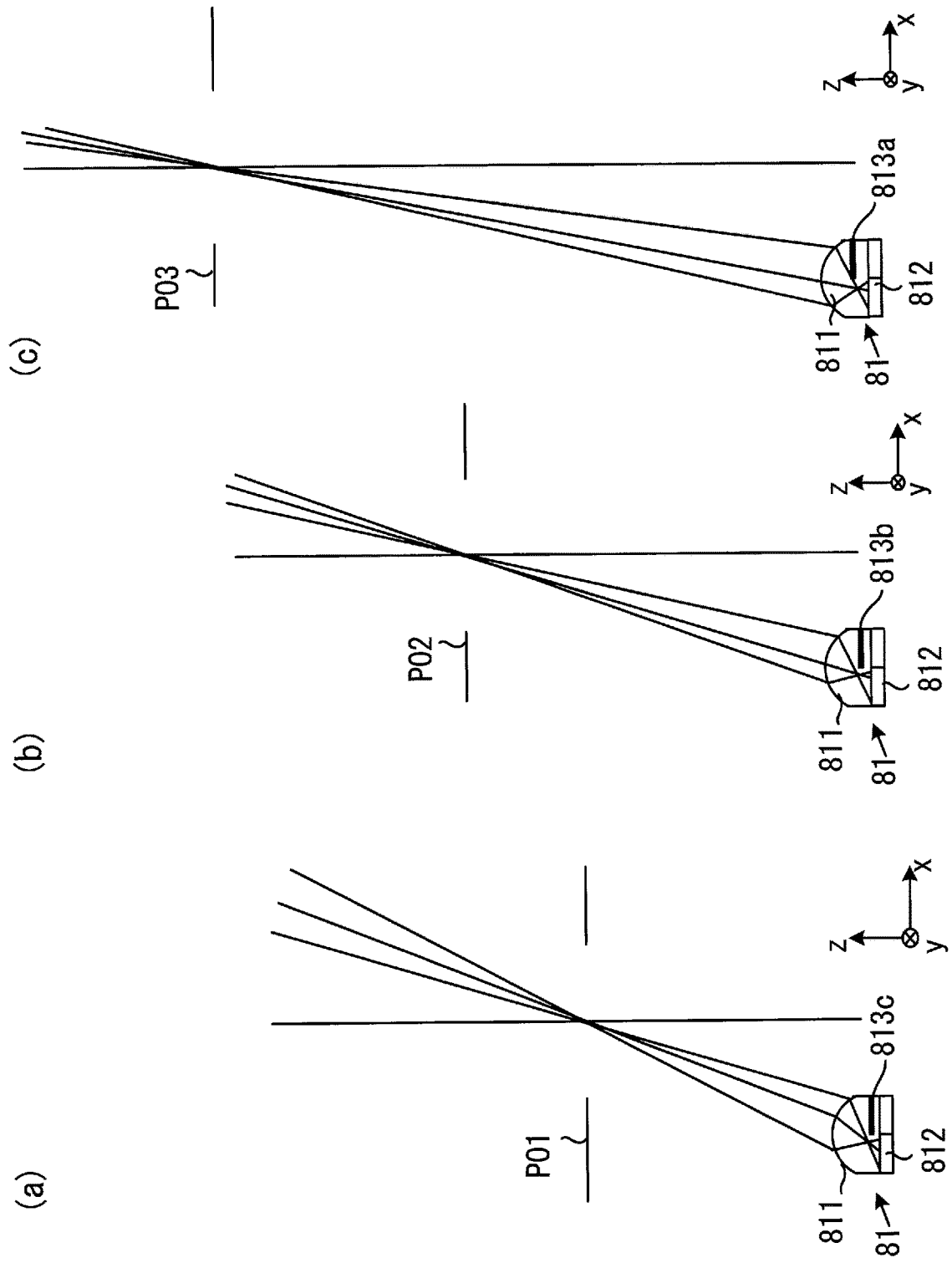

FIG. 5 schematically illustrates the relationship of the position at which the pupil of the photographic optical system 1 is projected via a microlens 811 to the position of the corresponding light blocking unit 813 along the z-axis, achieved in correspondence to each of three different exit pupil positions PO1, PO2 and PO3

As FIG. 5(a) indicates, the pupil having the exit pupil position PO1 at the photographic optical system 1 is projected via the microlens 811 onto the third light blocking portion 813c of a focus detection pixel 81 in the first pixel group 851. Namely, the third light blocking portion 813c is disposed at a position at which the pupil having the exit pupil position PO1 is projected via the microlens 811. As FIG. 5(b) indicates, the pupil having the exit pupil position PO2 at the photographic optical system 1 is projected via the microlens 811 onto the second light blocking portion 813b of a focus detection pixel 81 in the second pixel group 852. Namely, the second light blocking portion 813b is disposed at a position at which the pupil having the exit pupil position PO2 is projected via the microlens 811. As FIG. 5(c) indicates, the pupil having the exit pupil position PO3 at the photographic optical system 1 is projected via the microlens 811 onto the first light blocking portion 813a of a focus detection pixel 81 in the third pixel group 853. Namely, the first light blocking portion 813a is disposed at a position at which the pupil having the exit pupil position PO3 is projected via the microlens 811. It is to be noted that the third light blocking portion 813c, the second light blocking portion 813b and the first light blocking portion 813a represent the entire light blocking unit in the illustrations presented in FIGS. 5(a), 5(b) and 5(c) respectively. In addition, at the focus detection pixels 82 having structures similar to those of the focus detection pixels 81 so that the focus detection pixels 82 and the focus detection pixels 81 together achieve axial symmetry, relationships similar to those pertaining to the projection positions taken at the light blocking units 813 in the focus detection pixels 81 are achieved with regard to the projection positions taken at the light blocking units 823.

The pupils having the different exit pupil positions PO1, PO2 and PO3 are projected via microlenses 811 at positions different from one another among the individual pixel groups 850. This means that the focus detection pixels in the first pixel group 851, the focus detection pixels in the second pixel group 852 or the focus detection pixels in the third pixel group 853 can be used as optimal focus detection pixels for purposes of focus detection in conjunction with a specific photographic optical system 1 among photographic optical systems 1 having different exit pupil positions.

Figure 6:
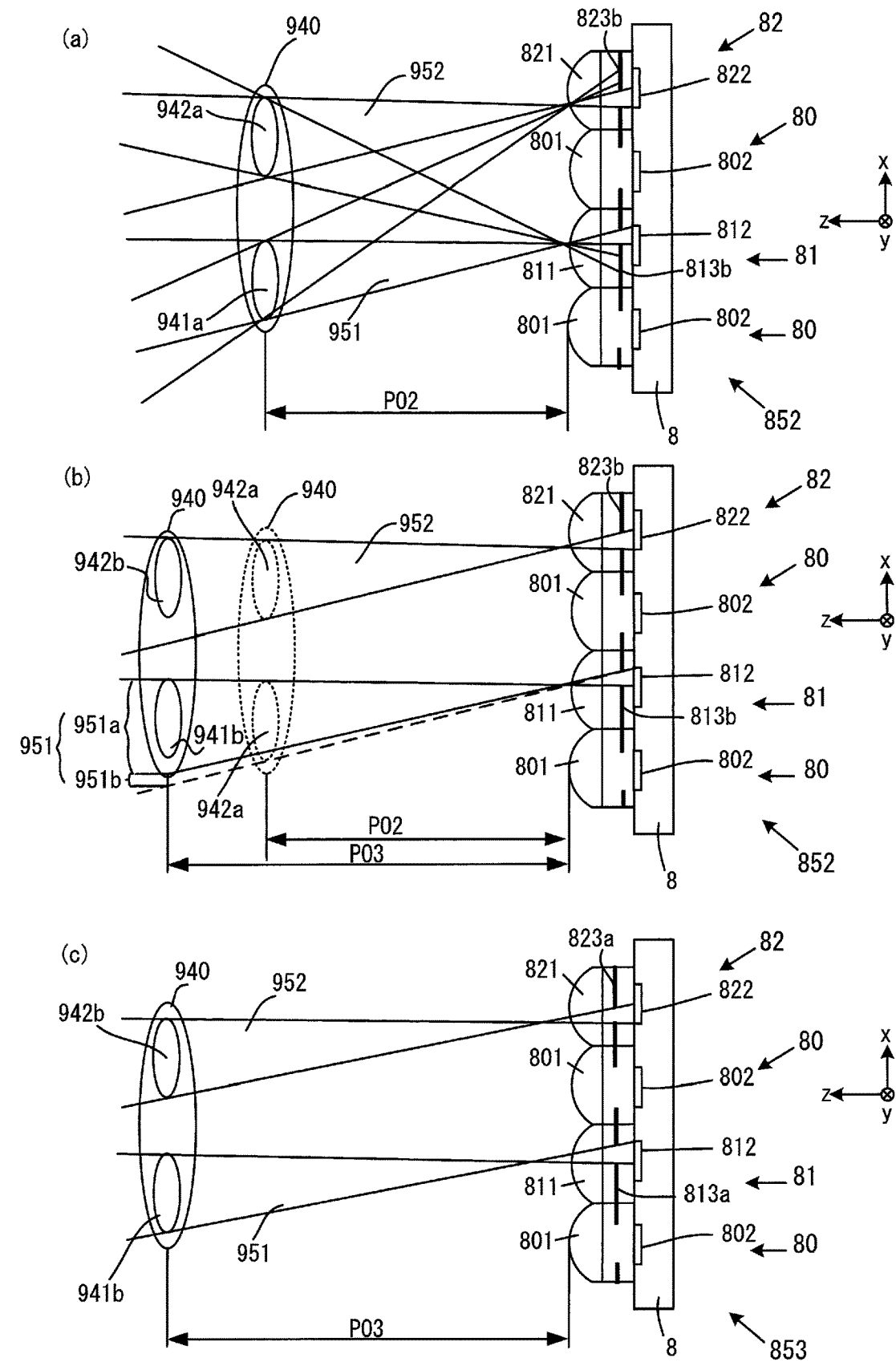

FIG. 6 presents schematic illustrations, each indicating a relationship of the photoelectric conversion units 812 and 822 in a focus detection pixel 81 and a focus detection pixel 82 present in the second pixel group 852 to the position of an exit pupil 940 of the photographic optical system 1. FIG. 6(a) shows the relationship achieved when a photographic lens body 300, having a photographic optical system 1, the pupil of which, taking the exit pupil position PO2, is projected at a position substantially matching the positions of the second light blocking portions 813b and 823b of the focus detection pixels 81 and 82 in the second pixel group 852, is mounted. In other words, it shows the relationship achieved when the photographic optical system 1 has the exit pupil position PO2, which achieves a conjugal relationship with the second light blocking portions 813b and 823b relative to the microlenses 811 and 821.

The photoelectric conversion unit 812 in the focus detection pixel 81 receives, via the microlens 811, a light flux 951 having departed the subject and passed through an exit pupil area 941a, i.e., one of the pair of exit pupil areas 941a and 942a at the photographic optical system 1. This means that the light having departed the exit pupil area 942a is blocked by the second light blocking portion 813b. The photoelectric conversion unit 822 in the focus detection pixel 82 receives, via the microlens 821, a light flux 952 having departed the subject and passed through the exit pupil area 942a at the photographic optical system 1. This means that the light having departed the exit pupil area 941a is blocked by the second light blocking portion 823b. As FIG. 6(a) indicates, the light fluxes 951 and 952 enter the photoelectric conversion units 812 and 822 respectively with little or no vignetting attributable to the structure of the photographic lens body 300.

FIG. 6(b) indicates the relationship achieved when a photographic lens body 300, which includes a photographic optical system 1 having the exit pupil position PO3 set at a greater distance compared to the photographic lens body 300 with the exit pupil position PO2, is mounted. In this case, the second light blocking portions 813b and 823b in the focus detection pixels 81 and 82 block light having been transmitted through portions (areas) different from the exit pupil areas 941a and 942a, which are part of the exit pupil 940 of the photographic optical system 1 described above. It is to be noted that the exit pupil 940 of the photographic optical system 1 having the exit pupil position PO2 is indicated with dotted lines in FIG. 6(b) for purposes of easy comparison.

The light flux 952 having departed the subject passes through an exit pupil area 942b at the photographic optical system 1 and then enters the photoelectric conversion unit 822 via the microlens 821 at the focus detection pixel 82. Since the exit pupil position PO3 by the photographic optical system 1 is set at a greater distance compared to the exit pupil position PO2, part of the light flux 951 having departed the subject is vignetted. Namely, light flux 951a in the light flux 951 passes through an exit pupil area 941b of the photographic optical system 1 and enters the photoelectric conversion unit 812 via the microlens 811, while light flux 951b in the light flux 951 is vignetted and thus does not enter the photoelectric conversion unit 812. This means that different amounts of light enter the photoelectric conversion units 812 and 822 in the focus detection pixels 81 and 82 respectively, resulting in the focus detection pixel signal output from the photoelectric conversion unit 812 being output at a lower output level compared to the output level of the focus detection signal output from the photoelectric conversion unit 822. In other words, if focus detection pixels 81 having light blocking units via which light is blocked by the second light blocking portions 813b are used in conjunction with the photographic optical system 1 having the exit pupil position PO3, the arithmetic operation accuracy of the focus detection operation would be compromised.

In conjunction with the photographic optical system 1 having the exit pupil position PO3, it is ensured that the light fluxes having departed the exit pupil areas 941b and 942b enter the focus detection pixels 81 and 82 having the first light blocking portions 813a and 823a disposed at positions at which the pupil at the exit pupil position PO3 is projected via the microlenses 811 and 821. As FIG. 6(c) illustrates, light enters the focus detection pixels 81 and 82 in the third pixel group 853 having disposed therein focus detection pixels 81 and 82 at which light is restricted by the first light blocking portions 813a and 823a set apart from the microlenses 811 and 821 over the smallest distance while allowing little or no vignetting as shown in FIG. 5(b).

In addition, it is ensured that light fluxes having departed exit pupil areas enter the focus detection pixels 81 and 82 with the third light blocking portions 813c and 823c disposed at positions at which the pupil at, for instance, the exit pupil position PO1 is projected via the microlenses 811 and 821 in conjunction with a photographic optical system 1 having an exit pupil position set over a distance shorter than PO2. In other words, it is ensured that the light fluxes having departed the exit pupil areas enter the focus detection pixels 81 and 82 in the first pixel group 851, at which light is restricted by the third light blocking portions 813c and 823c set apart from the microlenses 811 and 821 over the greatest distance. This means that light is allowed to enter the photoelectric conversion units 812 and 822 in any one of the pixel groups 850 with little or no vignetting, even when a photographic optical system 1 having a different exit pupil position is mounted. Thus, focus detection can be executed through the embodiment by using focus detection signals output from the focus detection pixels 81 and 82 having received light with little or no vignetting even when a different photographic lens body 300 is mounted or when the photographic lens body 300 is a zoom lens that includes a photographic optical system 1 with a variable exit pupil position.

It is to be noted that focus detection pixels 81 and 82 in the various pixel groups 850 set in the focus detection area 810b (see FIG. 3(a)), disposed at a position being symmetry with the focus detection area 810a relative to the center of the image-capturing surface 800, are different from the focus detection pixels 81 and 82 disposed in the focus detection area 810a. Namely, a focus detection pixel 82 is disposed in the focus detection area 810b at a position being symmetry to a focus detection pixel 81 in the focus detection area 810a relative to the center of the image-capturing surface 800. A focus detection pixel 81 is disposed at a position being symmetry to a focus detection pixel 82 in the focus detection area 810a relative to the center of the image-capturing surface 800.

In each pixel group 850 set in the focus detection area 810a, the focus detection pixels 81 and 82 disposed toward the − side end along the x-axis and the focus detection pixels 81 and 82 disposed toward the + side end along the x-axis are affected differently by oblique incidence of light having passed through the photographic optical system 1. For this reason, the light blocking units 813 and 823 in the focus detection pixels 81 and 82 disposed toward the + side end along the x-axis need to have a light blocking area, ranging along the x-axis, greater than the light blocking area of the light blocking units 813 and 823 of the focus detection pixels 81 and 82 disposed toward the − side end along the x-axis. The extent by which the light blocking area needs to increase can be determined by multiplying the distance to the focus detection pixels 81 and 82 measured from the center of the image-capturing surface 800, i.e., the image height, by a predetermined coefficient. In this case, the light blocking area of the light blocking units 813 and 823 may be made to increase linearly along the x-axis for pixels at positions closer to the + side end along the x-axis in the pixel group 850, or the light blocking area of the light blocking units 813 and 823 may be made to increase along the x-axis in steps, with each step corresponding to a predetermined number of focus detection pixels 81 and 82.

In each pixel group 850 in the focus detection area 810b, the light blocking units 813 and 823 in the focus detection pixels 81 and 82 disposed toward the − side end along the x-axis have a greater light blocking area, measured along the x-axis, in comparison to the light blocking area of the light blocking units 813 and 823 in the focus detection pixels 81 and 82 disposed toward the + side end along the x-axis. In this case, too, the light blocking area of the light blocking units 813 and 823 may be made to increase linearly along the x-axis for pixels at positions closer to the + side end along the x-axis in the pixel group 850, or the light blocking area of the light blocking units 813 and 823 may be made to increase along the x-axis in steps, with each step corresponding to a predetermined number of focus detection pixels 81 and 82. This means that the positional relationship along the x-axis, which extends perpendicular to the optical axes of the microlenses 811 and 812, between the light blocking units 813 and 823 of the focus detection pixels 81 and 82 disposed toward one end along the x-axis and the corresponding microlenses 811 and 812 in a pixel group 850 is different from the positional relationship of the light blocking units 813 and 823 in the focus detection pixels 81 and 82 disposed toward the other end, to the microlenses 811 and 812, along the x-axis extending perpendicular to the optical axes of the microlenses 811 and 812.

It is to be noted that light is not vignetted in the focus detection area 810c (see FIG. 3(a)) set in a central area of the image-capturing surface 800 of the image sensor 8 and for this reason, the light blocking units 813 and 823 do not need to have greater light blocking areas.

In addition, a given type of pixel group 850 may be disposed in a greater quantity in a focus detection area 810 set in a peripheral area of the image-capturing surface 800 of the image sensor 8, compared to the quantity of the particular pixel group 850 included in a focus detection area 810 set in a central area of the image-capturing surface 800, or a given type of pixel group 850 may be disposed with higher density in a focus detection area 810 set in a peripheral area. For instance, the first pixel group 851 and the third pixel group 853 may be set in greater quantities or with higher density relative to the second pixel group 852 in a focus detection area 810 on the periphery. In addition, the quantities of the first pixel group 851 and the third pixel group 853 may be increased or they may be disposed with even higher density in a focus detection area 810 located further toward the outer edge.

As an alternative, the first pixel group 851 having the focus detection pixels 81 and 82 corresponding to the exit pupil position PO3 shown in FIG. 5(c), may be disposed in greater quantity or with higher density, in comparison to the third pixel group 853 having the focus detection pixels 81 and 82 corresponding to the exit pupil position PO1 shown in FIG. 5(a). This means that the third pixel group 853 may be disposed in a smaller quantity or with lower density relative to the first pixel group 851. When a photographic lens body 300 with a photographic optical system 1 having an exit pupil position set at a greater distance (e.g., a telephoto lens) is mounted, an offset occurring at the focal position is bound to be more noticeable due to a smaller photographic depth of field. In contrast, when a photographic lens body 300 with a photographic optical system 1 having an exit pupil position set over a smaller distance (e.g., a wide-angle lens) is mounted, an offset occurring at the focal position is not readily noticeable because of a greater photographic depth of field. Accordingly, by disposing the first pixel group 851 corresponding to the exit pupil position PO3 in a greater quantity or with higher density, the extent to which focus detection accuracy is lowered can be minimized even when a photographic lens 300 with an exit pupil position set at a greater distance is mounted in the digital camera 100.

As an alternative, a pixel group 850 with focus detection pixels 81 and 82 corresponding to the exit pupil position of the photographic optical system 1 included in a photographic lens body 300 (e.g., a standard lens or a wide-angle lens) that is frequently used by the user may be disposed in greater quantity or with higher density within the focus detection areas 810.

The focus detection operation executed in the digital camera 100 equipped with the image sensor 8 structured as described above will be explained next.

As the photographic lens body 300 is mounted at the camera body 200, an electrical connection between the camera body 200 and the photographic lens body 300 is established via the electrical contact points 201 and 202 disposed at the mount unit. The body-lens communication unit 15 receives the lens information, i.e., information regarding the exit pupil position, from the lens data unit 4 in the photographic lens body 300, via the electrical contact points 201 and 202.

The selection unit 51 in the control unit 5 selects, based upon the lens information received from the photographic lens body 300, a pixel group 850 having focus detection pixels 81 and 82 best suited for the photographic optical system 1 included in the mounted photographic lens body 300. If the value representing the position of the exit pupil at the photographic optical system 1 exceeds a predetermined first threshold value, the selection unit 51 selects the third pixel group 853 that includes focus detection pixels 81 and 82 having the light blocking units 813 and 823 set apart from the microlenses 811 and 821 over the smallest distance. If the value representing the exit pupil position at the photographic optical system 1 is less than a predetermined second threshold value (<first threshold value), the selection unit 51 selects the first pixel group 851 that includes focus detection pixels 81 and 82 having the light blocking units 813 and 823 set apart from the microlenses 811 and 821 over the greatest distance. If the value representing the exit pupil position at the photographic optical system 1 is equal to or greater than the second threshold value and less than the first threshold value, the selection unit 51 selects the second pixel group 852. In other words, the selection unit 51 selects a specific type of pixel group 850 that includes focus detection pixels 81 and 82 having focus detection pupil positions with the smallest difference relative to the exit pupil position at the photographic optical system 1.

It is to be noted that the selection unit 51 is able to select a pixel group 850 within a given focus detection area 810 by switching to an optimal quantity of, or an optimal type of pixel group based upon the position of the particular focus detection area 810 on the image-capturing surface 800 of the image sensor 8 or based upon the position of the exit pupil at the photographic optical system 1.

In addition, when a photographic lens body 300 configured with a zoom lens is mounted, the position of the exit pupil changes in correspondence to the zoom position. In such a case, the selection unit 51 obtains information indicating the exit pupil position corresponding to the selected zoom setting based upon the lens information having been received and selects the pixel group 850 best suited to the exit pupil position indicated in the information having been obtained as described above. Through these measures, the pixel group 850 to be selected can be automatically switched by the selection unit 851 based upon the selected zoom setting. Information indicating exit pupil positions corresponding to different zoom settings is stored in advance in the lens data unit 4. It is to be noted that information indicating exit pupil positions corresponding to different zoom settings may be instead stored in advance in the storage unit 16 in the digital camera 100.

In addition, when executing focus detection based upon an output provided from a focus detection area 810 located near the center of the image-capturing surface 800 of the image sensor 8 (from the focus detection area 810*a* in FIG. 3(*a*)), the selection unit 851 may select the focus detection pixels 81 and 82 included in the first pixel group 851, the second pixel group 852 and the third pixel group 853. In this case, improvement will be obtained in focus detection accuracy in the subject tracking performance and in the subject identification performance. When executing focus detection based upon an output provided from a focus detection area 810 taking a peripheral position in the image-capturing surface 800 of the image sensor 8, the selection unit 851 selects only the pixel group 850 that includes the focus detection pixels 81 and 82 corresponding to the exit pupil position at the photographic optical system 1. In the peripheral area of the image-capturing surface 800, outputs from focus detection pixels 81 and 82 other than the focus detection pixels 81 and 82 corresponding to the exit pupil position at the photographic optical system 1 are bound to be affected by vignetting and the like. Accordingly, the outputs from the focus detection pixels 81 and 82 affected by vignetting and the like are not used for purposes of focus detection so as to minimize the extent to which the focus detection accuracy is lowered.

The focus detection operation circuit 14 calculates a defocus quantity through a phase detection method of the known art by using the focus detection signals output from the focus detection pixels 81 and 82 in a selected pixel group 850, among the focus detection signals output from all the focus detection pixels 81 and 82. The focus detection operation circuit 14 detects an extent of offset of a first signal train {an} having set therein in sequence the focus detection signals output from the photoelectric conversion units 812 in the focus detection pixels 81 relative to a second signal train {bn} having set therein in sequence the focus detection signals output from the photoelectric conversion units 822 in the focus detection pixels 82, and detects the focusing condition at the photographic optical system 1 represented by the defocus quantity. In other words, once the selection unit 851 selects focus detection pixels 81 and 82 as described above, the focus detection operation circuit 14 detects the position at which an image formed via the photographic optical system 1 achieves an in-focus state at the image sensor 8 based upon at least one set of outputs among the set of outputs from the focus detection pixels 81 and 82 in the first pixel group 851, the set of outputs from the focus detection pixels 81 and 82 in the second pixel group 852 and the set of outputs from the focus detection pixels 81 and 82 in the third pixel group 853.

The following advantages and operations are achieved through the embodiment described above.

(1) In each pixel group 850, focus detection pixels 81 and 82 that receive light fluxes having passed through pupil areas, i.e., portions of the pupil, of the photographic optical system 1, are disposed along the x-axis. Third light blocking portions 813*c* and 823*c* included in the focus detection pixels 81 and 82 in the first pixel group 851 are disposed between the microlenses 811 and 822 and the photoelectric conversion units 812 and 822 and restrict light having passed through specific exit pupil areas, i.e., portions of the exit pupil, of the photographic optical system 1. Second light blocking portions 813*b* and 823*b* included in the focus detection pixels 81 and 82 in the second pixel group 852 are disposed between the microlenses 811 and 822 and the photoelectric conversion units 812 and 822 and restrict light having passed through specific exit pupil areas, i.e., portions of the exit pupil, of the photographic optical system 1. First light blocking portions 813*a* and 823*a* included in the focus detection pixels 81 and 82 in the third pixel group 853 are disposed between the microlenses 811 and 822 and the photoelectric conversion units 812 and 822 and restrict light having passed through specific exit pupil areas, i.e., portions of the exit pupil, of the photographic optical system 1. The distance to the third light blocking portions 813*c* and 823*c*, measured from the microlenses 811 and 821 in the focus detection pixels 81 and 82 in the first pixel group 851, the distance to the second light blocking portions 813*b* and 823*b*, measured from the microlenses 811 and 821 in the focus detection pixels 81 and 82 in the second pixel group 852 and the distance to the first light blocking portions 813*a* and 823*a*, measured from the microlenses 811 and 821 in the focus detection pixels 81 and 82 in the third pixel group 853, are different from one another. Thus, even when a photographic optical system 1 with a different exit pupil position is mounted, focus detection signals originating from the focus detection pixels 81 and 82, at which light has entered without significant vignetting and the like, among the focus detection pixels in the various pixel groups 850, are output. In other words, the extent to which the accuracy of focus detection operation is lowered can be minimized.

(2) The light blocking units 813 and 823 are constituted with circuit wirings. Since such circuit wirings can be shared with other members, the number of required components can be kept down.

(3) The microlenses 811 and 812 at the focus detection pixels 81 and 82 disposed in the various pixel groups have a uniform focal length and the microlenses 811 and 821 are set apart from the corresponding photoelectric conversion units 812 and 822 over a uniform distance. This means that focus detection can be executed in an optimal manner in conjunction with photographic optical systems 1 with varying exit pupil distances simply by disposing light blocking units 813 and 823 in the focus detection pixels 81 and 82 adopting identical structures.

(4) The positional relationship of the light blocking units 813 and 823 to the microlenses 811 and 821, along the z-axis, in the focus detection pixels 81 and 82 disposed toward one end (on the − side along the x-axis) in each pixel group 850 set in a peripheral area of the image-capturing surface 800 of the image sensor 8 is different from the positional relationship of the light blocking units 813 and 823 to the micro-lenses 811 and 821, along the z-axis, in the focus detection pixels 81 and 82 disposed toward the other end (on the + side along the x-axis) in the pixel group. As a result, incident light obliquely entering the peripheral area of the image-capturing surface 800 can be received at the photoelectric conversion units 812 and 822 with little or no vignetting. In addition, focus detection can be executed in the peripheral area of the image-capturing surface 800 of the image sensor 8.

(5) The focus detection operation circuit 14 detects the focusing condition at the photographic optical system 1 by using the focus detection signals output from the focus detection pixels 81 and 82 in the first pixel group 851, the focus detection signals output from the focus detection pixels 81 and 82 in the second pixel group, or the focus detection signals output from the focus detection pixels 81 and 82 in the third pixel group 853. A plurality of focus detection areas 810, to be used for purposes of focusing condition detection, are set in the image-capturing surface 800 of the image sensor 8 and pixel groups 850 are present within the focus detection areas 810. Accordingly, even when a photographic optical system 1 having a different exit pupil position is mounted, a focus detection operation can be executed by using focus detection signals provided from focus detection pixels 81 and 82 that are not significantly affected by vignetting and the like, within a focus detection area 810.

(6) The selection unit 51 selects the first pixel group, the second pixel group or the third pixel group based upon the lens information regarding the position of the exit pupil in the photographic optical system 1, and the focus detection operation circuit 14 detects the focusing condition at the photographic optical system 1 by using the focus detection signals output from the focus detection pixels 81 and 82 present in the pixel group 850 having been selected by the selection unit 51. Thus, a focus detection operation can be executed by using the focus detection signals output from the focus detection pixels 81 and 82 least affected by vignetting and the like, in a pixel group among the plurality of pixel groups 850.

While the focus detection pixels 81 and 82 in the embodiment described above adopt the structures explained in reference to FIG. 4, the present invention may be adopted in conjunction with focus detection pixels 81 and 82 adopting structures other than those shown in FIG. 4.

Figure 8:
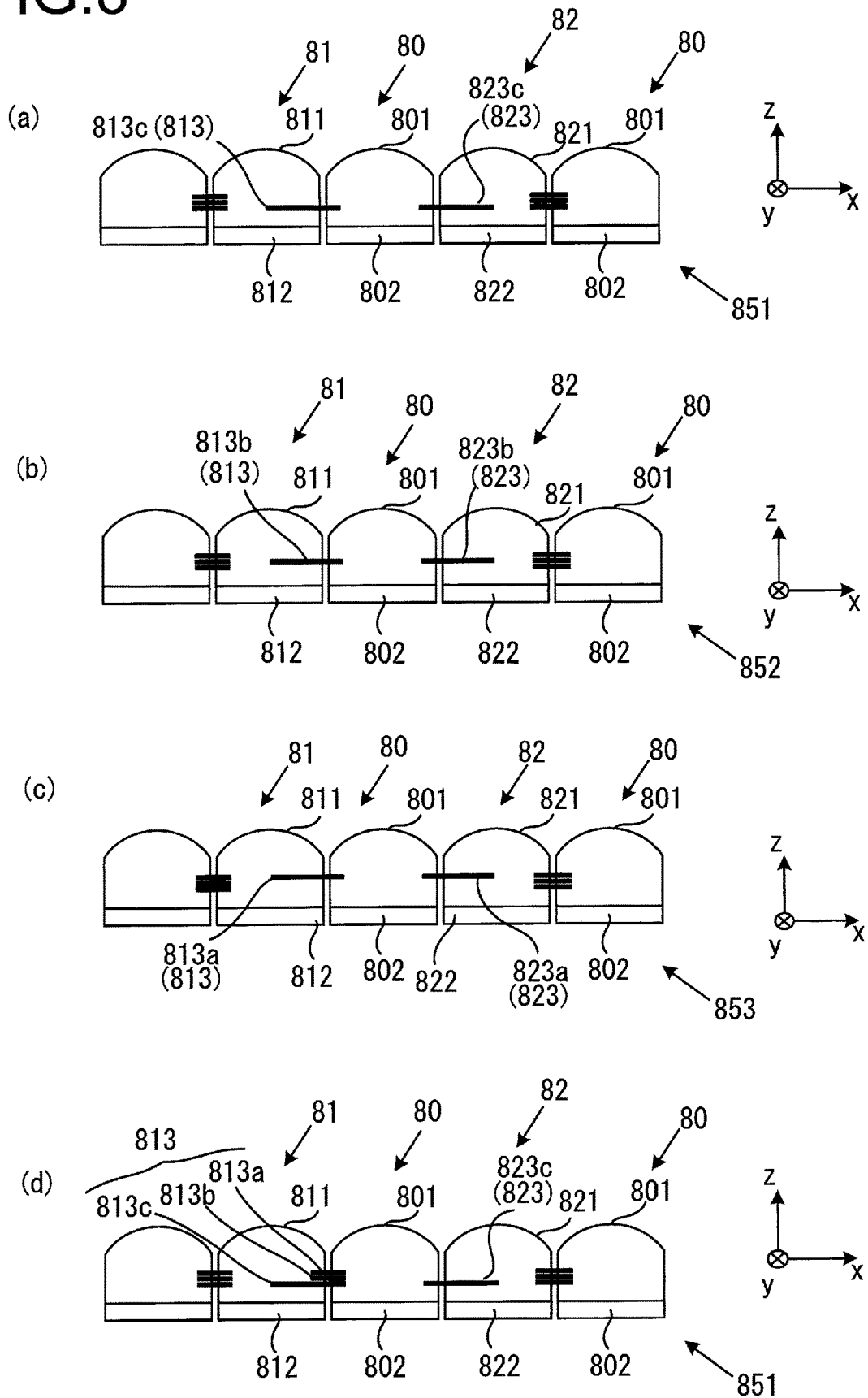

FIG. 8 presents schematic sectional views of the structures adopted in focus detection pixels 81 and 82 in another example. FIGS. 8(*a*), 8(*b*) and 8(*c*), similar to FIGS. 4(*a*), 4(*b*) and 4(*c*) respectively, illustrate the structures of image-capturing pixels 80 and focus detection pixels 81 and 82 in a first pixel group 851, a second pixel group 852 and a third pixel group 853 (see FIG. 3(*b*)) respectively. It is to be noted that in FIG. 8, too, a coordinate system that includes the x-axis, the y-axis and the z-axis is set, in much the same way as in the examples presented in FIG. 1 and FIG. 3.

The focus detection pixels 81 and 82 in the example presented in FIG. 8 each include a single light blocking unit 813 or 823. The focus detection pixels 81 and 82 in the first pixel group 851 shown in FIG. 8(*a*) respectively include third light blocking portions 813*c* and 823*c*, similar to those shown in FIG. 4(*a*), but do not include the first light blocking portions 813*a* and 823*a* and the second light blocking portions 813*b* and 823*b* in FIG. 4(*a*). Namely, the focus detection pixels 81 and 82 in FIG. 8(*a*) only include the third light blocking portions 813*c* and 823*c* having the largest light blocking areas, among the light blocking portions in the light blocking units 813 and 823 shown in FIG. 4(*a*). In this case, too, light fluxes having departed the photographic optical system 1 and passed through the microlenses 811 and 821, enter the photoelectric conversion units 812 and 822 of the focus detection pixels 81 and 82 with part of the light blocked (restricted) by the third light blocking portions 813*c* and 823*c*.

The focus detection pixels 81 and 82 in the second pixel group 852 shown in FIG. 8(*b*) respectively include second light blocking portions 813*b* and 823*b*, similar to those shown in FIG. 4(*b*), but do not include the first light blocking portions 813*a* and 823*a* and the third light blocking portions 813*c* and 823*c* in FIG. 4(*a*). Namely, the focus detection pixels 81 and 82 in FIG. 8(*b*) only include the second light blocking portions 813*b* and 823*b* having the largest light blocking areas, among the light blocking portions in the light blocking units 813 and 823 shown in FIG. 4(*b*). In this case, too, light fluxes having departed the photographic optical system 1 and passed through the microlenses 811 and 821, enter the photoelectric conversion units 812 and 822 of the focus detection pixels 81 and 82 with part of the light blocked (restricted) by the second light blocking portions 813*b* and 823*b*.

The focus detection pixels 81 and 82 in the third pixel group 853 shown in FIG. 8(*c*) respectively include first light blocking portions 813*a* and 823*a*, similar to those shown in FIG. 4(*c*) but do not include the second light blocking portions 813*b* and 823*b* and the third light blocking portions 813*c* and 823*c* in FIG. 4(*c*). Namely, the focus detection pixels 81 and 82 in FIG. 8(*a*) only include the first light blocking portions 813*a* and 823*a* having the largest light blocking areas, among the light blocking portions in the light blocking units 813 and 823 shown in FIG. 4(*c*). In this case, too, light fluxes having departed the photographic optical system 1 and passed through the microlenses 811 and 821, enter the photoelectric conversion units 812 and 822 of the focus detection pixels 81 and 82 with part of the light blocked (restricted) by the first light blocking portions 813*a* and 823*a*.

The focus detection pixels 81 and 82 adopting the structures described above in the alternative example presented in FIG. 8, make it possible to restrict light having departed the photographic optical system 1 in much the same way as that described in reference to the embodiment, while also making it possible to reduce the number of required components.

It is to be noted that the light blocking units 813 and 823 in the focus detection pixels 81 and 82 do not need to each include only one light blocking portion as in the example shown in FIGS. 8(*a*) through 8(*c*). For instance, the focus detection pixels 81 in the first pixel group 851 may each include a light blocking unit 813 constituted with a first light blocking portion 813*a*, a second light blocking portion 813*b* and a third light blocking portion 813*c* as illustrated in FIG. 8(*d*), in much the same way as the focus detection pixel 81 in FIG. 4(*a*). The focus detection pixels 82, on the other hand, may each include a light blocking unit 823 constituted with a third light blocking portion 823*c* alone without a first light blocking portion 823*a* or a second light blocking portion 823*b*. In this case, too, light having departed the photographic optical system 1 can be blocked (restricted) by the third light blocking portions 813*c* and 823*c*, as in the focus detection pixels 81 and 82 described in reference to the embodiment. It is to be noted that as an alternative to the example presented in FIG. 8(*d*), focus detection pixels 81, each having a light blocking unit 813 constituted with a single light blocking portion, and focus detection pixels 82, each having a light blocking unit 823 constituted with a plurality of light blocking portions, as shown in FIG. 4(*a*), may be used. In addition, while structures that may be adopted in the focus detection pixels 81 and 82 in the first pixel group 851 have been described in reference to FIG. 8(*d*), the structures explained above may be adopted in focus detection pixels 81 and 82 disposed in the second pixel group 852 or the third pixel group 853.

Next, in reference to FIG. 9, structures adopted in focus detection pixels 81 and 82 in yet another example will be explained. The focus detection pixels 81 and 82 described below adopt different structures each corresponding to the position at which a specific focus detection pixel is disposed on the image-capturing surface 800 of the image sensor 8. In other words, focus detection pixels 81 and 82 disposed in an area near the center (e.g., in the focus detection area 810*c* in FIG. 3(*a*)) of the image-capturing surface 800 of the image sensor 8 adopt structures different from those of focus detection pixels 81 and 82 disposed in a peripheral area (e.g., in the focus detection area 810*d* in FIG. 3(*a*)) of the image-capturing surface 800.

Figure 9:
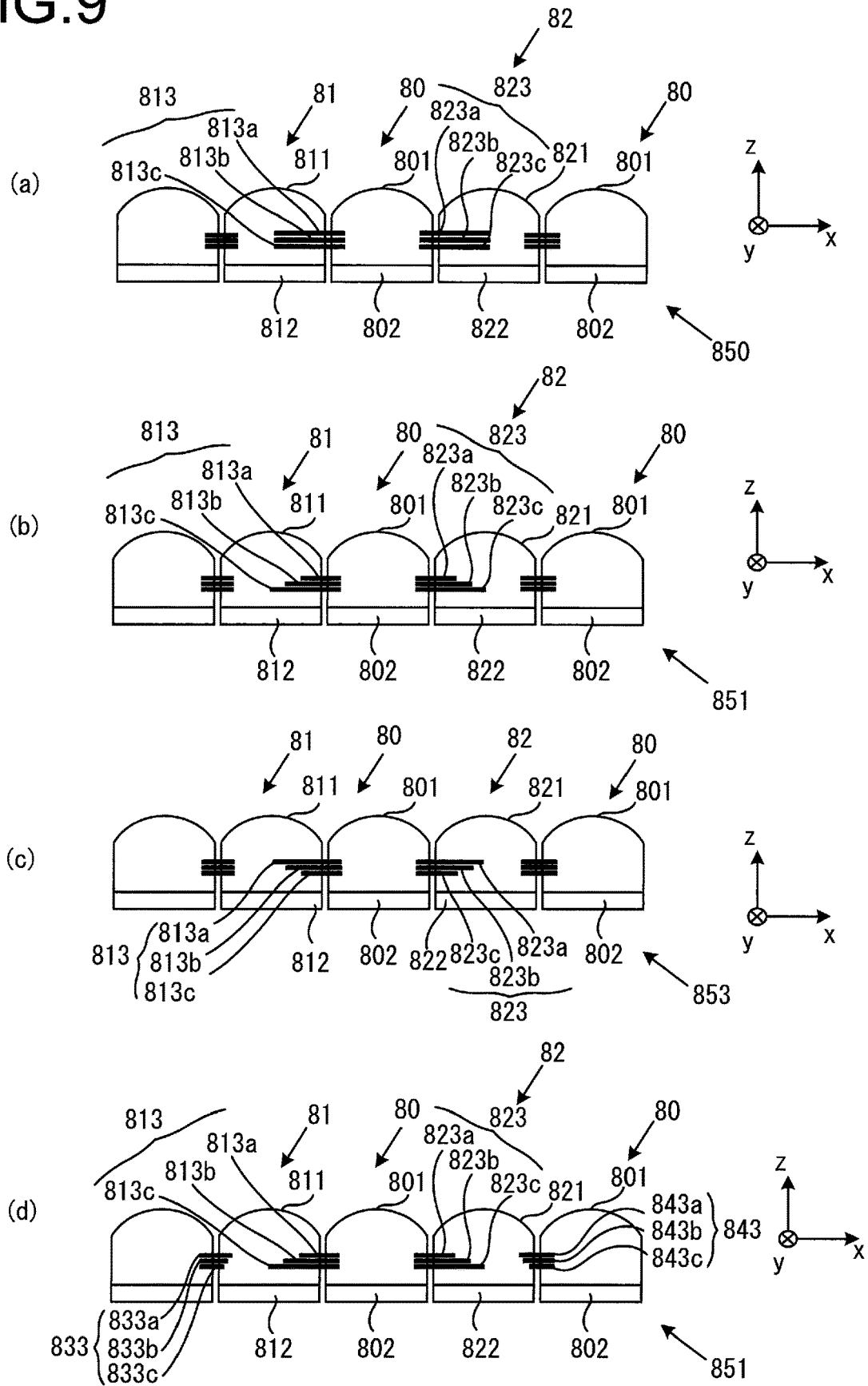

FIG. 9(*a*) presents a schematic sectional view of the structures adopted in the focus detection pixels 81 and 82 in a pixel group 850 included in the focus detection area 810*c* located near the center of the image-capturing surface 800. A first light blocking portion 813*a*, a second light blocking portion 813*b* and a third light blocking portion 813*c* constituting a light blocking unit 813 of the focus detection pixel 81 in FIG. 9(*a*) have light blocking areas similar to those of the first light blocking portion 813*a* in FIG. 4(*c*), the second light blocking portion 813*b* in FIG. 4(*b*) and the third light blocking portion 813*c* in FIG. 4(*a*) respectively. Likewise, a first light blocking portion 823*a*, a second light blocking portion 823*b* and a third light blocking portion 823*c* constituting a light blocking unit 823 of the focus detection pixel 82 in FIG. 9(*a*) have light blocking areas similar to those of the first light blocking portion 823*a* in FIG. 4(*c*), the second light blocking portion 823*b* in FIG. 4(*b*) and the third light blocking portion 823*c* in FIG. 4(*a*) respectively.

In the focus detection pixels 81 and 82 disposed at positions at which they are not readily subjected to the adverse effect of vignetting, e.g., in an area near the center of the image-capturing surface 800, light having departed the photographic optical system 1 can be blocked (restricted) via their first light blocking portions 813*a* and 823*a*, second light blocking portions 813*b* and 823*b* and third light blocking portions 813*c* and 823*c*. Since diffraction of light and the like can be minimized by blocking light fluxes with a plurality of light blocking portions, even better light blocking performance against light fluxes can be assured. As the light blocking performance, i.e., the pupil-splitting accuracy, is improved, the accuracy of focus detection executed by the focus detection operation circuit 14 can be ultimately improved.

FIG. 9(*b*) presents a schematic sectional view of the structures adopted in the focus detection pixels 81 and 82 in the first pixel group 851 included in the focus detection area 810*d* located near the periphery of the image-capturing surface 800. At a light blocking unit 813 of the focus detection pixel 81, a second light blocking portion 813*b* has a greater light blocking area than a first light blocking portion 813*a*, and a third light blocking portion 813*c* has a greater light blocking area than the second light blocking portion 813*b*. At a light blocking unit 823 of the focus detection pixel 82, a second light blocking portion 823*b* has a greater light blocking area than a first light blocking portion 823*a*, and a third light blocking portion 823*c* has a greater light blocking area than the second light blocking portion 823*b*.

FIG. 9(*c*) presents a schematic sectional view of the structures adopted in the focus detection pixels 81 and 82 in the third pixel group 853 included in the focus detection area 810*d*. At a light blocking unit 813 of the focus detection pixel 81, a second light blocking portion 813*b* has a greater light blocking area than the third light blocking portion 813*c*, and a first light blocking portion 813*a* has a greater light blocking area than the second light blocking portion 813*b*. At a light blocking unit 823 of the focus detection pixel 82, a second light blocking portion 823*b* has a greater light blocking area than a third light blocking portion 823*c*, and a first light blocking portion 823*a* has a greater light blocking area than the second light blocking portion 823*b*.

Light having departed the photographic optical system 1 can be blocked (restricted) by the first light blocking portions 813*a* and 823*a*, the second light blocking portions 813*b* and 823*b* and the third light blocking portions 813*c* and 823*c* at the focus detection pixels 81 and 82 in the first pixel group 851 and the focus detection pixels 81 and 82 in the third pixel group 853, as explained above. Since diffraction of light and the like can be minimized by blocking light fluxes with a plurality of light blocking portions, even better light blocking performance against light fluxes can be assured. As the light blocking performance, i.e., the pupil splitting accuracy, is improved at the focus detection pixels 81 and 82 in the peripheral area of the image-capturing surface 800, the accuracy of focus detection executed by the focus detection operation circuit 14 can be ultimately improved.

It is to be noted that the focus detection pixels 81 and 82 in the second pixel group 852 included in a focus detection area 810 set at the periphery of the image-capturing surface

800 may adopt the structures illustrated in FIG. 9(*a*) or the structures illustrated in FIG. 4(*b*).

As an alternative, the focus detection pixels 81 and 82 in the first pixel group 851 may adopt the structures illustrated in FIG. 9(*d*). Each focus detection pixel 81 includes a light blocking unit 833 as well as a light blocking unit 813. The light blocking units 813 and 833 are disposed on the sides facing opposite each other along the x-axis, i.e., the light blocking unit 813 is disposed toward the + side along the x-axis and the light blocking unit 833 is disposed toward the − side along the x-axis. The light blocking unit 813 in FIG. 9(*d*) adopts a structure similar to that shown in FIG. 9(*b*). The light blocking unit 833 includes a first light blocking portion 833*a*, a second light blocking portion 833*b* and a third light blocking portion 833*c*. The distance setting apart the second light blocking portion 833*b* from the microlens 811 is greater than the distance setting apart the first light blocking portion 833*a* from the microlens 811. The distance setting apart the third light blocking portion 833*c* from the microlens 811 is greater than the distance setting apart the second light blocking portion 833*b* from the microlens 811. In addition, the second light blocking portion 833*b* has a greater light blocking area than the third light blocking portion 833*c* and the first light blocking portion 833*a* has a greater light blocking area than the second light blocking portion 833*b*. At the focus detection pixel 81 structured as described above, light having departed the photographic optical system 1 can be better blocked by the light blocking unit 813 on the + side along the x-axis and by the light blocking unit 833 on the − side along the x-axis. As a result, the pupil splitting accuracy is improved, which, in turn, makes it possible to improve the accuracy of the focus detection executed by the focus detection operation circuit 14.

The focus detection pixel 82 in FIG. 9(*d*) includes a light blocking unit 843 as well as a light blocking unit 823. The light blocking units 823 and 843 are disposed on the sides facing opposite each other along the x-axis, i.e., the light blocking unit 823 is disposed toward the − side along the x-axis and the light blocking unit 843 is disposed toward the + side along the x-axis. The light blocking unit 823 in FIG. 9(*d*) adopts a structure similar to that shown in FIG. 9(*b*). The light blocking unit 843 includes a first light blocking portion 843*a*, a second light blocking portion 843*b* and a third light blocking portion 843*c*. The distance setting apart the second light blocking portion 843*b* from the microlens 811 is greater than the distance setting apart the first light blocking portion 843*a* from the microlens 811. The distance setting apart the third light blocking portion 843*c* from the microlens 811 is greater than the distance setting apart the second light blocking portion 843*b* from the microlens 811. In addition, the second light blocking portion 843*b* has a greater light blocking area than the third light blocking portion 843*c* and the first light blocking portion 843*a* has a greater light blocking area than the second light blocking portion 843*b*. At the focus detection pixel 82 structured as described above, light having departed the photographic optical system 1 can be better blocked by the light blocking unit 823 on the − side along the x-axis and by the light blocking unit 843 on the + side along the x-axis. As a result, the pupil splitting accuracy is improved, which, in turn, makes it possible to improve the accuracy of the focus detection executed by the focus detection operation circuit 14.

It is to be noted that as an alternative to the example presented in FIG. 9(*d*), focus detection pixels 81 may each include a light blocking unit 813 and a light blocking unit 833 and focus detection pixels 82 may each include a light blocking unit 823 and a light blocking unit 843 in the third pixel group 853. In such a case, the second light blocking portion 833*b* has a greater light blocking area than the first light blocking portion 833*a*, and the third light blocking portion 833*c* has a greater light blocking area than the second light blocking portion 833*b* at the light blocking unit 833. In addition, the second light blocking portion 843*b* has a greater light blocking area than the first light blocking portion 843*a*, and the third light blocking portion 843*c* has a greater light blocking area than the second light blocking portion 843*b* at the light blocking unit 843. In the focus detection pixels 81 and 82 in the third pixel group 853 structured as described above, too, better light blocking performance is assured in much the same way as in the focus detection pixels 81 and 82 in the first pixel group 851. As a result, the pupil splitting accuracy is improved, which, in turn, makes it possible to improve the accuracy of the focus detection executed by the focus detection operation circuit 14.

—Variations—

The following variations are also within the scope of the present invention and may be adopted in combination with the embodiment described above.

Figure 7:
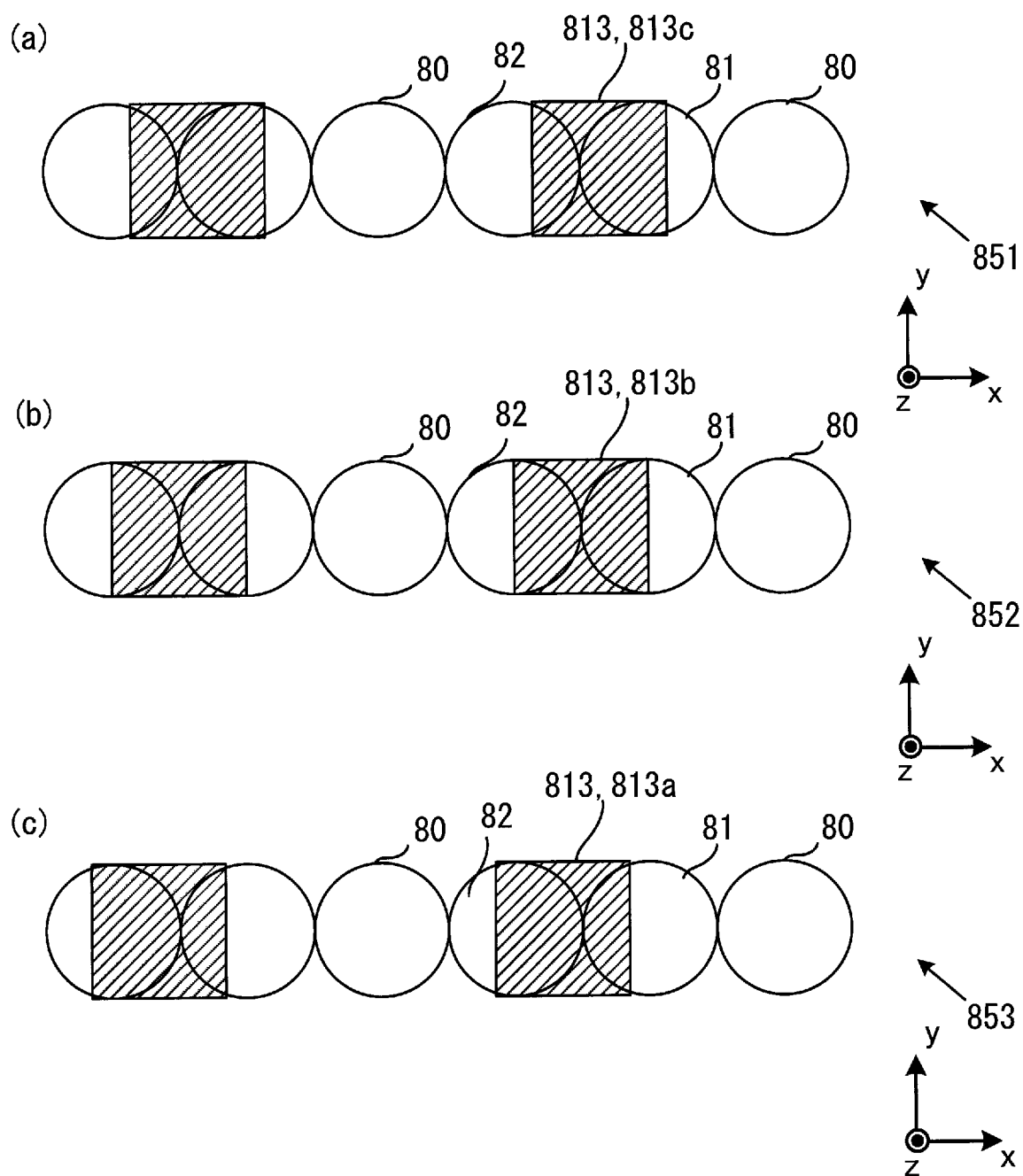

FIG. 7 presents schematic plan views of focus detection pixels 81 and 82 disposed in an image sensor 8 in a variation. FIG. 7(*a*) illustrates a first pixel group 851, FIG. 7(*b*) illustrates a second pixel group 852 and FIG. 7(*c*) illustrates a third pixel group 853. In each pixel group 850, a pair of focus detection pixels 81 and 82 is disposed on one side of each image-capturing pixel 80 with another pair of focus detection pixels disposed on the other side instead of disposing an image-capturing pixel 80 between a focus detection pixel 81 and a focus detection pixel 82 along the x-axis. Each pair of focus detection pixels 81 and 82 share a common light blocking unit 813. The light blocking unit 813 has the same size light blocking area regardless of to which pixel group 850 the particular pair of focus detection pixels 81 and 82 belongs. Namely, a third light blocking portion 813*c* in the first pixel group 851, the second light blocking portion 813*b* in the second pixel group 852 and the first light blocking portion 813*a* in the third pixel group 853 have light blocking areas of a uniform size.

The position at which the light blocking unit 813 is disposed is adjusted along the x-axis in correspondence to each pixel group 850. In the first pixel group 851 shown in FIG. 7(*a*), the third light blocking portion 813*c* is disposed at a position offset by a predetermined extent toward the + side along the x-axis relative to the position of the second light blocking portion 813*b* in the second pixel group 852 in FIG. 7(*b*). In the third pixel group 853 shown in FIG. 7(*c*), the first light blocking portion 813*a* is disposed at a position offset by a predetermined extent toward the − side along the x-axis relative to the position of the second light blocking portion 813*b* in the second pixel group 852 in FIG. 7(*b*). It is to be noted that a predetermined extent of offset may be determined by multiplying the distance to the focus detection pixels 81 and 82, measured from the center of the image-capturing surface 800, i.e., the image height, by a predetermined coefficient. In addition, if the light blocking portions are disposed at positions having symmetry relative to the center of the image-capturing surface 800 of the image sensor 8, the third light blocking portion 813*c* in the first pixel group 851 simply needs to be offset toward the − side along the x-axis and the first light blocking portion 813*a* in the third pixel group 853 simply needs to be offset toward the + side along the x-axis.

By assuming the structure described above, the number of required components can be kept down.

In addition, while the selection unit 51 selects, based upon the lens information, a pixel group 850 optimal for the particular photographic optical system 1 included in the photographic lens body 300 mounted at the digital camera, among the first pixel group 851 through the third pixel group 853 in the embodiment described earlier, the present invention is not limited to this example.

For instance, the first pixel group 851 through the third pixel group 853 may all be selected, and a focus detection operation may be executed by applying weight to the signals output from the optimal pixel group. For instance, the first pixel group 851 may be best suited to the particular photographic optical system 1 and the third pixel group 853 may be least suited to the photographic optical system 1. Under such circumstances, weight 1 may be applied to the focus detection results obtained by the first pixel group 851, weight 0.5 may be applied to the focus detection results obtained by the second pixel group 852 and weight 0.1 may be applied to the focus addiction results obtained by the third pixel group 853.

Furthermore, the focus detection operation may be executed by using two types of pixel groups 850, among the first pixel group 851 through the third pixel group 853, by excluding the pixel group 850 least suited to the photographic optical system 1.

Moreover, pixel groups 950 may be disposed with any positional arrangement. For instance, a single type of pixel group 850 (e.g., the second pixel group 852) may be disposed in a central area of the image-capturing surface 800 (e.g., near 810c in FIG. 3) and three types of pixel groups 850 (e.g., the first pixel group 851 through third pixel group 853) may be disposed in a peripheral area of the image-capturing surface 800 (e.g., near 810a in FIG. 3).

As long as features characterizing the present invention remain intact, the present invention is in no way limited to the particulars of the embodiment described above and any mode conceivable within the scope of the technical teachings of the present invention is within the scope of the present invention.

The disclosure of the following priority application is herein Incorporated by reference:
Japanese Patent Application No. 2015-254898 filed Dec. 25, 2015

REFERENCE SIGNS LIST

5 . . . control unit, 8 . . . image sensor, 14 . . . focus detection operation circuit, 15 . . . body-lens communication unit, 51 . . . selection unit, 80 . . . image-capturing pixel, 81, 82 . . . focus detection pixel, 100 . . . digital camera, 811, 821 . . . microlens, 813, 823 . . . light blocking unit, 812, 822 . . . photoelectric conversion unit, 850 . . . pixel group, 851 . . . first pixel group, 852 . . . second pixel group, 853 . . . third pixel group

The invention claimed is:

1. An image sensor comprising:
a plurality of first pixels each having a first photoelectric conversion unit that photoelectrically converts light having transmitted through an optical system and a first light blocking unit that blocks part of light entering the first photoelectric conversion unit, the plurality of first pixels outputting a first signal used for focus detection based on photoelectric conversion at the first photoelectric conversion unit;
a plurality of second pixels each having a second photoelectric conversion unit that photoelectrically converts light having transmitted through the optical system and generates an electric charge and a second light blocking unit that blocks part of light entering the second photoelectric conversion unit, the plurality of second pixels outputting a second signal used for focus detection based on photoelectric conversion at the second photoelectric conversion unit; and
an output unit that outputs at least one of the first signal output from the plurality of first pixels and the second signal output from the plurality of second pixels based on information of at least one of a photographic depth of field and a distance from an optical axis of the optical system.

2. The image sensor according to claim 1, wherein
the output unit outputs at least one of the first signal output from the plurality of first pixels and the second signal output from the plurality of second pixels based on information of at least one of a distance between the first pixel and the optical axis of the optical system, a distance between the second pixel and the optical axis of the optical system, and the photographic depth of field.

3. The image sensor according to claim 1, wherein
the first light blocking unit is provided at a first distance from the first photoelectric conversion unit, and
the second light blocking unit is provided at a second distance that is different from the first distance from the second photoelectric conversion unit.

4. The image sensor according to claim 1, wherein
the first pixel includes a first microlens, and the first photoelectric conversion unit photoelectrically converts light having transmitted through the first microlens;
the second pixel includes a second microlens, and the second photoelectric conversion unit photoelectrically converts light having transmitted through the second microlens; and
a distance between the first microlens and the first light blocking unit is different from a distance between the second microlens and the second light blocking unit.

5. The image sensor according to claim 1, wherein
an area of the first light blocking unit is different from an area of the second light blocking unit.

6. The image sensor according to claim 1, wherein
a light blocking area by which the first light blocking unit blocks light is different from a light blocking area by which the second light blocking unit blocks light.

7. The image sensor according to claim 1, wherein
the first pixel receives light having transmitted through a first region of the optical system, and
the second pixel receives light having transmitted through a second region of the optical system, the second region being different from the first region.

8. The image sensor according to claim 1, wherein
an amount of light that the first photoelectric conversion unit photoelectrically converts is different from an amount of light that the second photoelectric conversion unit photoelectrically converts.

9. The image sensor according to claim 1, wherein
an area of the first light blocking unit included in each of at least two first pixels among the plurality of first pixels is different depending on a position of an image-capturing surface, and an area of the second light blocking unit included in each of at least two second pixels among the plurality of second pixels is different depending on a position of the image-capturing surface.

10. The image sensor according to claim 9, wherein
an area of the first light blocking unit included in the first pixel located near a center of the image-capturing surface among the plurality of first pixels is smaller than an area of the first light blocking unit included in the first pixel located near an edge of the image-capturing surface, and
an area of the second light blocking unit included in the second pixel located near the center of the image-capturing surface among the plurality of second pixels is smaller than an area of the second light blocking unit included in the second pixel located near the edge of the image-capturing surface.

11. The image sensor according to claim 1, wherein
a number of the first pixels is different from a number of the second pixels.

12. The image sensor according to claim 1, wherein
the first light blocking unit is a first circuit wiring disposed in the first pixel, and the second light blocking unit is a second circuit wiring disposed in the second pixel.

13. An image-capturing device comprising:
the image sensor according to claim 1; and
a control unit that controls a position of the optical system to a focal position at which an image by the optical system achieves an in-focus state at the image sensor based on at least one of the first signal output from the plurality of first pixels and the second signal output from the plurality of second pixels.

\* \* \* \* \*